United States Patent

Oshida et al.

[11] Patent Number: 5,677,755
[45] Date of Patent: Oct. 14, 1997

[54] METHOD AND APPARATUS FOR PATTERN EXPOSURE, MASK USED THEREFOR, AND SEMICONDUCTOR INTEGRATED CIRCUIT PRODUCED BY USING THEM

[75] Inventors: Yoshitada Oshida, Fujisawa; Yasuhiko Nakayama, Yokohama; Masahiro Watanabe, Kawasaki; Minoru Yoshida, Yokohama; Kenichirou Fukuda, Machida, all of Japan

[73] Assignee: Hitachi, Ltd., Tokyo, Japan

[21] Appl. No.: 330,726

[22] Filed: Oct. 28, 1994

[30] Foreign Application Priority Data

Oct. 29, 1993 [JP] Japan ................................ 5-271596

[51] Int. Cl.$^6$ ............................................ H01L 21/30
[52] U.S. Cl. ............................ 355/53; 355/71; 355/77
[58] Field of Search ............................ 355/71, 53, 77; 359/489, 498

[56] References Cited

U.S. PATENT DOCUMENTS

| | | | |
|---|---|---|---|
| 5,245,470 | 9/1993 | Keum | 359/489 X |
| 5,300,972 | 4/1994 | Kamon | 355/71 |
| 5,311,249 | 5/1994 | Kamon et al. | 355/71 |
| 5,329,333 | 7/1994 | Noguchi et al. | 355/53 |
| 5,365,371 | 11/1994 | Kamon | 355/53 X |
| 5,436,761 | 7/1995 | Kamon | 355/71 X |
| 5,459,000 | 10/1995 | Unno | 359/489 X |

FOREIGN PATENT DOCUMENTS 5-188576  7/1993  Japan .

Primary Examiner—Arthur T. Grimley
Assistant Examiner—David A. Lane
Attorney, Agent, or Firm—Antonelli, Terry, Stout & Kraus, LLP.

[57] ABSTRACT

A pattern exposure method including the steps of irradiating a mask or reticle having a desired original pattern written thereon with light with a desired directivity from an illuminating light source for exposure, and projecting a transmitted or reflected light from said mask to an object to be exposed through a projection optical system, wherein a pattern-dependent polarizing mask for giving polarization characteristics in compliance with the direction of the pattern on the mask to the illuminating light transmitted through the pattern; and a pattern exposure apparatus including a illuminating light for exposure, a mask or a reticle, an illumination optical system for irradiating the mask with light emitted from the light source, and a projection optical system for projecting the transmitted or reflected light from the mask onto the object to be exposed, further including polarizing unit for polarizing the illuminating light on the pupil of the projection optical system so as to be nearly rotationally symmetric with respect to the center of the pupil when the mask is not used; and a mask, used with said pattern exposure apparatus, for giving pattern-dependent polarization characteristics; and a semiconductor integrated circuit including fine patterns at least in two directions formed by the pattern exposure method using the pattern-dependent polarizing mask.

39 Claims, 29 Drawing Sheets

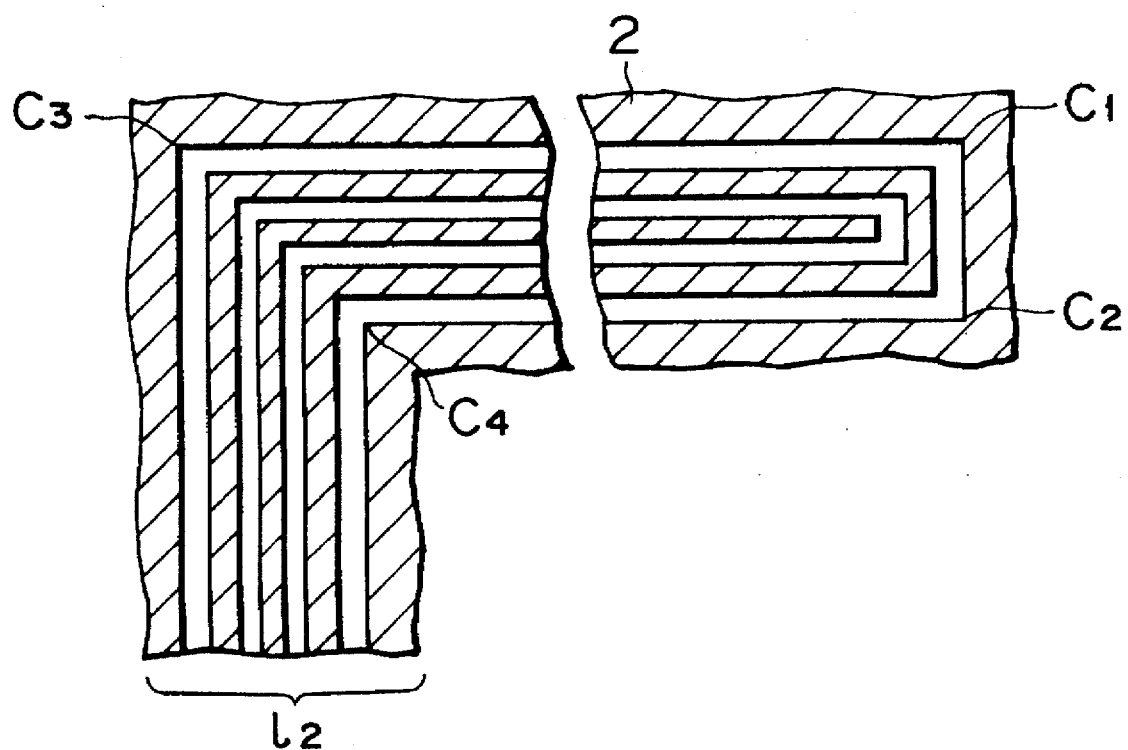

DF = 0μm

DF = 0.5μm

DF = 0.75μm

DF = 0μm

DF = 0.5μm

DF = 0.75μm

DF = 0μm

DF = 0.5μm

DF = 0.75μm

DF = 0μm

DF = 0.5μm

DF = 0.75μm

FIG. 11A
FIG. 11B
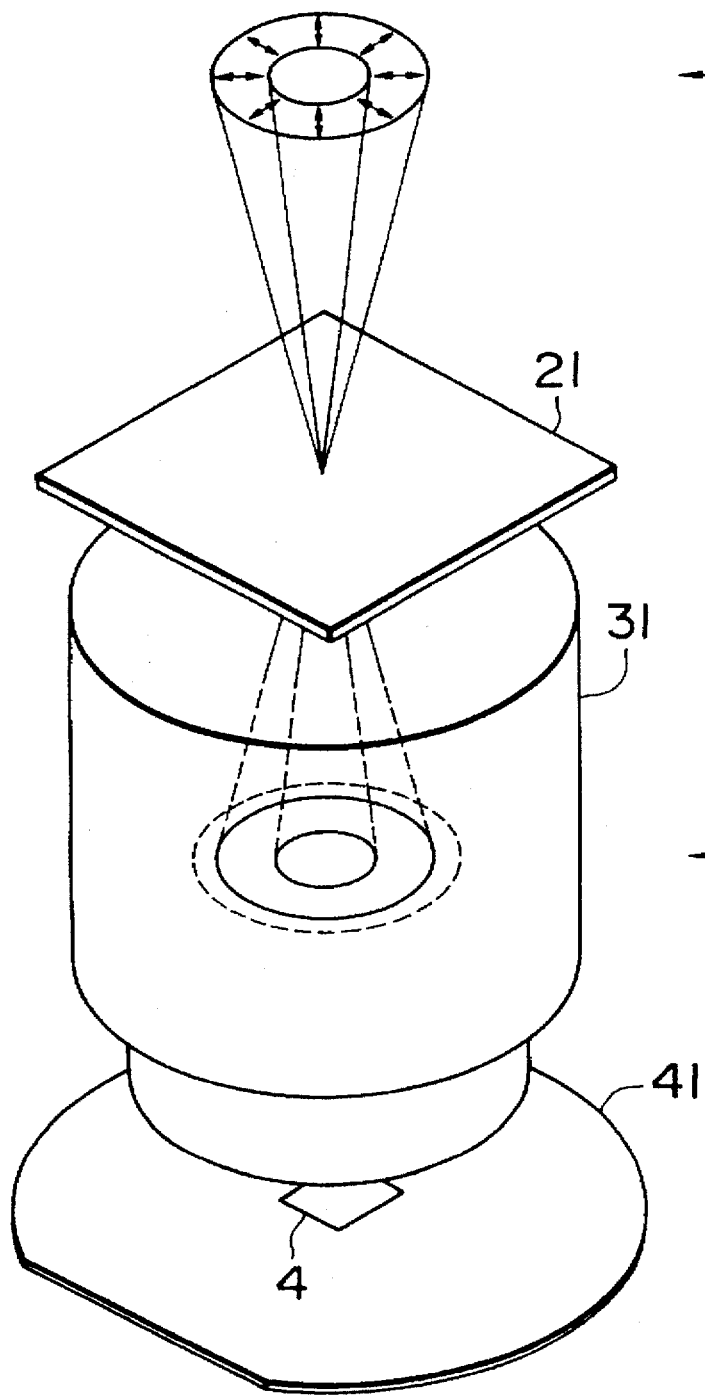
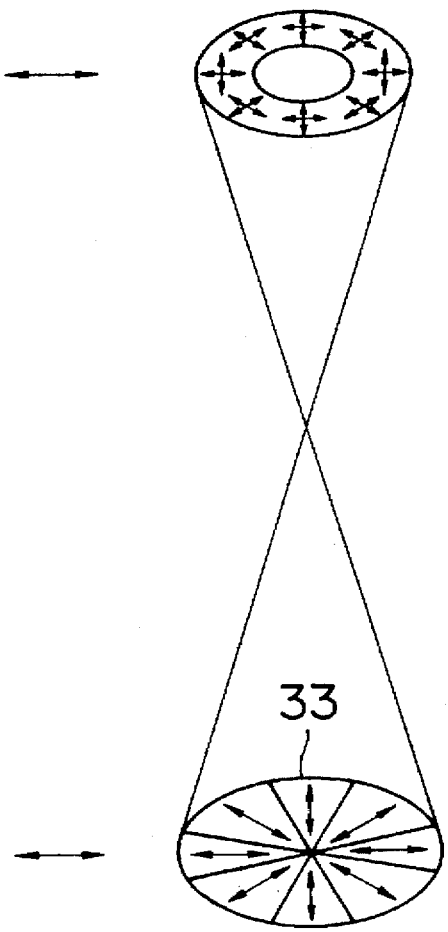

DF = 0μm

DF = 0.5μm

DF = 0.75μm

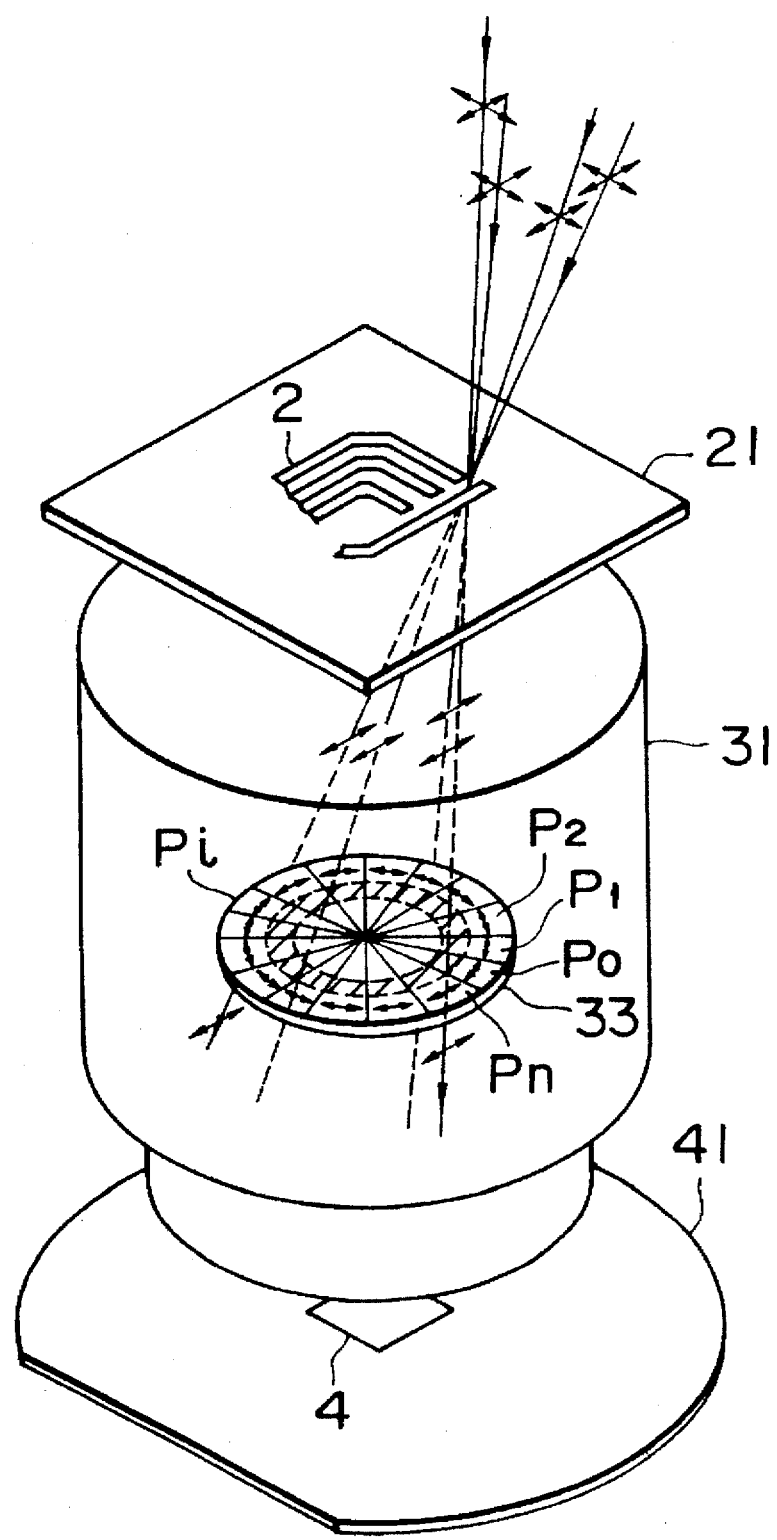

RESOLUTION OF 0.2 μm PATTERN (NA 0.57, λ=365nm)

METHOD AND APPARATUS FOR PATTERN EXPOSURE, MASK USED THEREFOR, AND SEMICONDUCTOR INTEGRATED CIRCUIT PRODUCED BY USING THEM

BACKGROUND OF THE INVENTION

This invention relates to a method and an apparatus for pattern exposure, a mask used therefor, and a semiconductor integrated circuit made by using the method and other items mentioned above, and more particularly to exposure of a pattern with a line width close to limits of pattern dimensions determined by the maximum permissible of diffraction of light used for exposure.

As semiconductor integrated circuits grow progressively more miniature, the minute circuit structures which can be transferred to the resist have reached a stage where the resolution is decided by the maximum permissible diffraction limit of light. For this reason, in recent years, various techniques have been contrived which are referred to as super-resolution techniques. If the wavelength of exposure light is designated by $\lambda$ and the numerical aperture of the projection optical system is designated by NA, then the resolution R of the exposure optical system is determined by $$R=k_1 \cdot \lambda/NA$$

Heretofore, $k_1$ has generally been considered to be the permissible limit when it is about 0.6 to 0.8.

The techniques mentioned above are drawing attention as methods for breaking this limit and solving to a certain degree the problem of the decrease in the focal depth, which has become increasingly serious with the progressive miniaturization. The representative techniques of them are ① the phase shift method, ② ring zone illumination method, ③ the diagonal-array oblique illumination method, etc.

When the technique of ① is used, by setting the pattern-transmitted light rays of the adjacent ones of the repetitive patterns so that they are 180° out of phase with each other, the light intensity is made zero between those closely located of the patterns whose images are formed by the projection optical system, resulting in a distinct separation of the repetitive patterns. With this method, however, when two-dimensional patterns are formed, the phases of the adjacent patterns cannot necessarily be made to differ by 180°, so that in some portions, the resolution is not better than that obtainable by the conventional exposure methods. This is a great restriction in the design of patterns and with the above method, there are some patterns which are impossible to design.

With the conventional exposure method of ②, as shown in FIG. 4A, the directivity σ of the illuminating light (the ratio d of the projected extent on the pupil of the illuminating light to the pupil diameter D of the projection optical system, that is, σ=d/D) used to be about 0.5. In contrast, as shown in FIG. 4B, by making the illuminating light projected in a ring shape on the pupil shaped, and by setting the outside diameter and the inside diameter of this ring respectively at about 0.7 and 0.5, for example, the MTF (Modulation Transfer Function) of the high frequency region of the pattern is made high. Consequently, the resolution in this method is higher than with the conventional illumination, but yet lower than in the phase shift method of ①.

In the method of ③, the illuminating light on the pupil of the projection optical system is provided at four points arranged diagonally as shown in FIG. 4C. By this arrangement of illumination, a better resolution is obtained in those portions of a pattern extending in the x and y directions than in the ring zone illumination of ②. However, for the patterns lying at angles of 45° from the x and y directions, the resolution is lower than in the ring zone illumination of ②, and also lower than in the conventional illumination with the conventional σ=0.5.

The present invention has been made to solve the above-mentioned problem of the super-resolution techniques to which development efforts have been directed in recent years.

The problem can be summarized as follows. The phase shift method of ① is a method capable of obtaining the maximum resolution in the existing methods, but when this resolution is to be maintained, some specific patterns which are impossible to design, and this is a formidable obstacle in the design and manufacture of LSI's. The ring zone illumination method of ② is unable to obtain a resolution as high as in the method of ①. The method of ③ has a lower resolution than in the method of ①, but has a higher resolution for patterns extending in x and y directions and a notably poor resolution for the patterns lying at 45° from the x and y directions compared with the method of ②.

SUMMARY OF THE INVENTION

The present invention has as its object to solve the above problem and realize a resolution at an equal or higher level than that obtainable by the phase shift method of ① without the occurrence of patterns impossible to design.

In order to achieve the above object, according to the present invention, there are provided means mentioned below which are used for radiating the mask (or reticle) having a desired original pattern delineated thereon with light with a desired directivity from a light source for exposure, projecting the light transmitted through or reflected by the mask onto an object to be exposed through a projection optical system to transfer the original patter to the resist. To be more specific, as for the directivity of illumination, the so-called ring zone illumination or oblique illumination is adopted, and a pattern-dependent polarizing mask is used which provides the illuminating light having passed through the pattern with polarization characteristics in compliance with the direction of the pattern on the mask. For the exposure light of the ring zone illumination or oblique illumination on the pupil of the projection optical system, the state of its polarization should preferably be almost rotationally symmetric with respect to the center of the pupil when the above-mentioned mask is not used. Also, it is preferable to arrange near the pupil of the projection optical system a polarizer element (or an analyzer element), the state of polarization of which is almost rotationally symmetric with regard to the center of the pupil.

As the pattern-dependent polarizing mask, a mask is used in which the direction of a tangent to the edge of the pattern on the mask is almost parallel with polarized light components or intersects almost at right angles with the direction of polarization of the pattern-transmitted (or pattern-reflected) light rays of the illuminating light. The above object can be achieved by using the above-mentioned mask having a pattern comprising a portion A transmitting (or reflecting) the illuminating light and a portion B slightly transmitting (or reflecting) but substantially blocking (or hardly reflecting) the illuminating light. With regard to the portions A and B, it is preferable to set the amplitude transmittance (or the amplitude reflectance) of the portion B substantially blocking the light to be 30% or less of the amplitude transmittance (or the amplitude reflectance) of the light-transmitting portion A. As for the directivity of the ring zone illumination or oblique illumination, arrangement is made such that one of the ± first-order light rays of the refracted light from the minimum pattern on the mask illuminated by the illuminating light passes through the pupil of the projection optical system and the other light ray is not allowed to pass through.

Means for providing the polarization characteristics on the above mask can be realized by using an anisotropic medium, a minute polarizing prism structure, a dichroic object, or a fine slit structure. The minute polarizing prism structure can be realized by using a structure made in such a way that a film is formed by multi-layer vapor deposition on the faces inclined from the edges to the center of the light transmitting portion of a pattern, a transparent object is fit into the recessed space between the inclined faces and, finally, the surface is made flat. The above-mentioned fine slit structure is made such that a single or many fine lines are written along the edge line of the light-transmitting portion of the pattern. The fine line or lines should preferably be electrically conductive.

By use of the above-mentioned method, it is possible to expose the resist to form a minute semiconductor integrated circuit in a pattern structure impossible to realize by the phase shifter. Furthermore, it is possible to expose to write fine semiconductor integrated circuits which cannot be resolved by the so-called ring zone illumination or oblique illumination with the directivity of conventional illumination without any restriction on the direction of the pattern.

More specifically, the pattern of this minute semiconductor integrated circuit includes at least repetitive patterns and the line width w or the repetition pitch p of the repetitive patterns, if the exposure light wavelength is denoted by $\lambda$ and the numerical aperture of the projection optical system is denoted by NA, satisfies $0.25\ \lambda/NA < w < 0.5\ \lambda/NA$ or $0.5\ \lambda/NA < p < 1.0\ \lambda/NA$. And, the pattern of this minute semiconductor integrated circuit includes patterns lying at substantially 45° from the two directions intersecting at right angles with each other and also includes a pattern which cannot be exposed by the phase shifter method, and the line width w or the repetition pitch p of the repetitive pattern, if the exposure light wavelength is denoted by $\lambda$ and the numerical aperture of the projection optical system is denoted by NA, satisfies $0.25\ \lambda/NA\ 21\ w < 0.5\ \lambda/NA$ or $0.5\ \lambda/NA < p < 1.0\ \lambda/NA$.

When the above-mentioned method is applied to a negative resist, the region of the mask where a pattern is formed are an opaque region of the mask, and after the resist is exposed, the unpolymerized region of the resist is removed at the developing process, and then, the unprotected region of the film is etched and removed. Therefore, in the region where a desired pattern is to be formed, a fine pattern as mentioned above, for example, which gives polarization characteristics, is not formed there, but the fine patterns are written in the surrounding light-transmitting region. If the pattern to be formed in this case is an isolated pattern, the fine patterns need not be written in a wide range around the isolated pattern, but the fine patterns have only to be written in substantially the same range as the width of the pattern to be resolved by the exposure optical system. This is not limited to the case of an isolated pattern, but also in a case where there is no pattern in the outside region of the outermost area of the region where fine patterns are densely formed, it is only necessary to write the fine patterns in substantially the same range as the width of the pattern to be resolved by this exposure optical system in the region outside the densely written patterns.

In right-angled corner or extreme end of a pattern, fine patterns for providing polarization characteristics are sometimes unable to provide sufficient polarization characteristics. In such a case, patterns lying at 45° from the directions intersecting at right angles with each other or fine patterns in a circular arc are written at the corner or extreme end.

By using the above-mentioned method, a high resolution can be obtained, but when there is on the mask patterns for providing polarization characteristics for example, which are long in the x direction, and its extreme end is close to patterns long in the y direction, it is sometimes difficult to obtain a sufficient resolution in the space between the two portions close to each other. This occurs when the end portion of the pattern does not have sufficient polarization characteristics for transmitting a polarized light component at right angles with the end portion of the pattern and blocking a polarized light component in parallel with the end portion of the pattern. In this case, a reticle provided with a phase shifter is used for one of the two patterns (or groups of patterns) in the x direction and y directions.

By having the light shine through an isolated pattern using the mask with patterns having polarization characteristics and a polarized light ring illumination, a higher resolution can be obtained than by having the light shine through the conventional mask with the directivity of ordinary illumination or with ordinary ring illumination. In addition, around the pattern having the polarization characteristics mentioned above, fine patterns are provided, the phase of which differs by $\pi$ from the phase of the light transmitted through the pattern.

As will be discussed in greater detail later with reference to FIGS. 28 and 29, exposure equipment is used which has values normally fixed for the numerical aperture NA of the projection lens and the exposure light wavelength $\lambda$. In this case, it is possible to set the condition for obtaining the best resolution by selecting the directivity of the polarized light ring illumination mentioned above according to the line width of the pattern for exposure.

The function of the present invention will be described with reference to FIGS. 5 to 9.

Suppose that when the pattern is long in the y direction as shown in FIG. 5A, this pattern allows a linearly polarized light oscillating in the y direction to pass and does not allow the linearly polarized light oscillating in the x direction to pass. As for the directivity, the illumination used for irradiating the mask of this pattern is the so-called ring zone illumination or oblique illumination. In the case of ring zone illumination as shown in FIG. 5B, for example, let us consider the work of the luminous fluxes $B_1$, $B_2$, $B_3$, $B_4$, $B_5$, $B_6$, $B_7$, $B_8$ from various directions for irradiating this pattern. When a mask is not used, those light rays reach the positions $B_1'$, $B_2'$, $B_3'$, $B_4'$, $B_5'$, $B_6'$, $B_7'$, $B_8'$ on the pupil of the projection lens.

If the polarized light rays of the eight luminous fluxes are set to intersect at right angles with a line which is perpendicular to the optical axis and goes through the optical axis of the projection optical system, the luminous fluxes $B_1$ and $B_5$ out of the eight luminous fluxes pass through the pattern in the y direction, while the luminous fluxes $B_3$ and $B_7$ hardly pass through the pattern. The luminous fluxes $B_2$, $B_4$, $B_6$, $B_8$ located between $B_1$, $B_5$ and $B_3$, $B_7$ pass substantially half as much as the maximum light transmittance. As for the luminous fluxes $B_1$ and $B_5$, after they pass through the pattern, their principal light rays reach $B_1'$ and $B_5'$. The diffracted light rays spread in the x direction around the 0-order light rays $B_1'$ and $B_5'$.

It is well known that if the diffracted light ray in the x direction can pass the pupil for a wide range, a high resolution can be obtained. Therefore, in the present invention, the luminous fluxes $B_1$ and $B_5$ almost in its entirety pass through the pattern extending in the y direction, thus giving a high resolution as mentioned above, while for the luminous fluxes $B_3$ and $B_7$, as is clear from the above description, the diffracted light falling on the pupil passes only in a narrow range, which means a decrease in the resolution. But, since those luminous fluxes hardly pass through this pattern, the minute pattern can be transferred to the resist at the exposure step without decreasing the resolution. The luminous fluxes $B_2$, $B_4$, $B_6$ and $B_8$ are the conventional illuminating light of ③ mentioned above and, therefore, the resolution obtainable by them is not so good as that by $B_1$ and $B_5$ and to top off with that, the intensity of the transmitted light rays $B_2$, $B_4$, $B_6$ and $B_8$ is half as much, the resolution due to the luminous fluxes $B_1$ and $B_5$ is dominant.

As is understandable from what has been described, since in the present invention only the illuminating light rays which produce the highest resolution are used, the resolution which could not be achieved by the conventional methods of ② and ③ can be obtained. By the polarization property of the illuminating light and the polarized light transmission characteristics according to the direction of a pattern mentioned above, in addition to the pattern in the y direction mentioned above, a high resolution is realized similarly for patterns arranged in any direction. The high resolution obtainable regardless of the direction or the arrangement of the patterns is what has been impossible to realize by the phase shift method of ①.

The resolution for the patterns by the methods of ② and ③ and also by the present invention, which were obtained by simulation for comparing the function of the present invention with the conventional super resolution methods, are shown in FIGS. 6A to 9C. In order to exhibit the effects of the present invention, the pattern width for exposure used was 0.25 μm, the i line of a mercury lamp with the wavelength of 365 nm was used, and the numerical aperture of the projection optical system was 0.57. FIGS. 6A to 6C show a case of ring zone illumination, and it will be understood that the separation of patterns is poor even at the focusing point.

FIGS. 7A to 7C show a case of oblique illumination of ③ to the pattern extending in the x and y directions, and the improvement in the resolution is notable compared with the ring zone illumination, but the pattern separation worsens with defocus at 0.5 μm. In FIGS. 8A to 8C, in which the patterns lying at 45° from the x and y directions were used, the resolution is inferior to that by ring zone illumination. FIGS. 9A to 9C show the resolution of a pattern obtained with an ordinary mask by the exposure method of the present invention, that is, with a mask when the ratio of transmittance between the light transmitting portions and the light blocking portions used in FIGS. 6A to 8C is infinite. It will be understood that clear images could be obtained at a wider range of focus than in FIGS. 6A to 8C.

The pattern on the mask comprises portions A transmitting the illuminating light and portions B transmitting a little but substantially blocking the light. The light rays transmitted through the portions A and B are 180° out of phase with each other. By using the ring zone illumination and the oblique illumination to illuminate this mask, the resolution is further improved. By setting the amplitude transmittance of the portion B substantially blocking the light at 30% or less of the amplitude transmittance of the portion A, a high resolution can be obtained. Particularly when the amplitude transmittance of the portion B is set at nearly 22%, the separation of the patterns becomes superlative.

This is because, when the amplitude transmitance of the light blocking portion of the mask is 22%, the zero-order light and the first-order light of the ring zone illumination or oblique illumination become substantially equal in intensity, and the contrast by interference of the two light rays is most accentuated, so that the repetitive patterns are separated most clearly.

If the polarization of the illuminating light on the pupil of the projection optical system without using a mask is nearly rotationally symmetric with respect to the center of the pupil, clear patterns can be transferred sufficiently onto the wafer at the exposure step with a better resolution than in the conventional method even when ring zone illumination or oblique illumination is not used. Particularly in this case, when the directivity σ of illumination is large, a relative decrease of contrast in the high frequency areas of the pattern which used to occur before does not occur, making it possible to expose the resist with high resolution.

In the case of a negative resist in which a desired pattern is an opaque area, since the light blocking region and the light transmitting region adjacent to the light blocking region need to be resolved clearly, by providing the light transmitting region with electrically conductive fine patterns, for example, which have polarization characteristics, a high resolution as with the positive resist can be realized. Given the bending of light around into the geometrical shadow (diffraction), the width of the surrounding portions for providing the polarization characteristics has only to be about the resolution limit of the projection lens or larger. If a 100% light transmitting region is provided in the area further outside the fine patterns and the amount of exposure for the neighboring region giving the polarization characteristics is arranged to be enough to expose the negative resist underneath and this resist remains undissolved after the developing step, then the resist in the 100% transmitting region also has the resist underneath exposed and remain, so that the desired pattern can be formed in the resist with high resolution.

If fine patterns lying in the 45° direction or circular fine patterns for giving the polarization characteristics are provided around a right-angled bend or the end portion of a desired pattern, smooth polarization characteristics are obtained to secure a higher resolution.

By using the super-resolution method according to the present invention and the phase shifter together, a sufficient resolution can be given when the end portion or the outermost portion of a pattern is to be transferred to the wafer precisely or when two groups of repetitive patterns are both extending in the x and y directions and located very close to each other. In the former case, by providing an auxiliary pattern for shifting the transmitted light along by the surroundings of the desired pattern, it is possible to suppress the widening of the foot portion of the pattern, and in the latter case, the light intensity between the adjacent two groups of patterns can be kept at low level.

According to the pattern exposure method according to the present invention, by using the projection optical system of the conventional exposure apparatus without any modifications to it, it is possible to transfer patterns to the wafer with far better resolution at the exposure process than the resolution of the conventional pattern transfer. An improvement in the performance of the semiconductor integrated circuits, which will be achieved by the techniques of the present invention, will result in an outstanding enhancement of the semiconductor integrated circuit technology, and at the same time, will enlarge the yield in the production of semiconductor circuits. There will also be huge economic effects which may result from possible reductions in the investment in the production facilities for the semiconductor integrated circuits.

BRIEF DESCRIPTION OF THE DRAWINGS

FIG. 2 is a plan view of the mask (or reticle) in the present invention;

FIG. 11A is a perspective view of the illumination system of the exposure apparatus in the present invention, and FIG. 11B is a perspective view showing the state of polarization;

FIG. 14 is a perspective view of the illumination system of the exposure apparatus using the mask in FIGS. 13A, 13B and 13C;

DESCRIPTION OF THE PREFERRED EMBODIMENTS

FIG. 1 is an embodiment of the present invention.

Figure 1A:
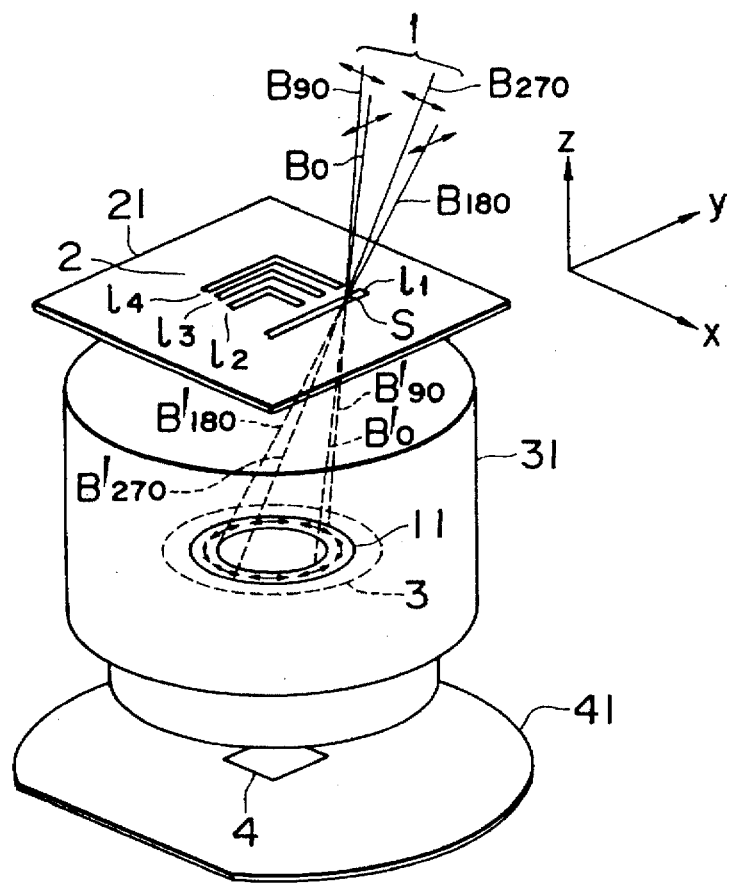
FIG. 1A is a perspective view of the illumination system of a pattern exposure apparatus.

FIG. 1A shows a projection exposure apparatus, and reference numeral 1 denotes illuminating light rays. The method for forming the illuminating light rays will be described in detail later. The partial light rays $B_0$, $B_{90}$, $B_{180}$ and $B_{270}$ of the illuminating light each have a linearly polarized light as shown in FIG. 1A, and when a mask 2 is not used, they fall on the ring-shaped zone, indicated by the illuminating light 11, on a pupil 3 of a reducing lens 31 of a projection optical system. The irradiated light rays $B_0'$, $B_{90}'$, $B_{180}'$ and $B_{270}'$ are linearly polarized light rays as indicated on the pupil.

On a mask 2 of the present invention, there are written patterns $l_1$, $l_2$, $l_3$ and $l_4$ arranged in the x and y directions, for example, to impart polarization characteristics in compliance with the directions of the patterns to the light rays irradiated to and transmitted through those patterns.

Figure 1B:
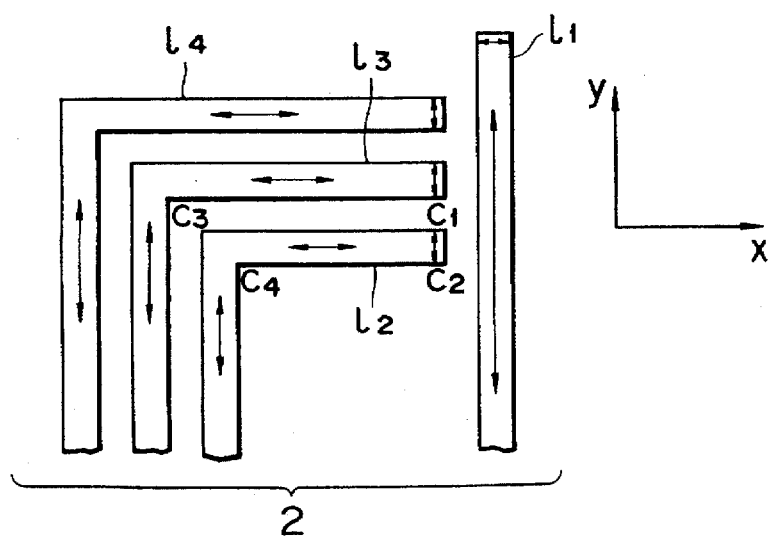
FIG. 1B is a plan view of a mask used therefor.

To be more specific, if $l_2$ in FIG. 1B is taken up as an example, since the pattern end $C_1$ to $C_2$ is arranged in the y direction, the linearly polarized light rays in the y direction are substantially 100% transmitted, while the linearly polarized light rays in the x direction are blocked. Likewise, the portion surrounded by $C_1$, $C_2$, $C_3$ and $C_4$ is positioned in the x direction, the linearly polarized light in the x direction is substantially 100% transmitted, but the linearly polarized light in the y direction is blocked. By this arrangement, the illuminating light with directivity of $B_{90}$ and $B_{270}$ passes effectively through the portion in the x direction surrounded by $C_1$, $C_2$, $C_3$ and $C_4$. Therefore, the diffracted light coming from this pattern contributes to image formation by the light expanding in a wide range (corresponding to the pupil diameter) on the pupil, making it possible to perform exposure of a high resolution pattern on an exposed chip area on a wafer 41.

Similarly, the polarized light component in the y direction passes through the pattern end between $C_1$ and $C_2$ and other patterns arranged in the y direction, but the polarized light component in the x direction is blocked by those patterns and, therefore, the patterns in the y direction can be transferred to the resist with high resolution. The pattern-dependent polarization characteristics described above are provided for the mask, and by using the polarized light ingeniously and having the patterns effectively transmit the illuminating light with a directivity convenient for image formation with high resolution, exposure of the resist with high resolution through the pattern can be realized.

FIG. 2 is an embodiment of a pattern-dependent polarizing mask for imparting the polarization characteristic in compliance with the direction of the pattern in FIGS. 1A and 1B. FIG. 2 shows the pattern of $l_2$ in FIG. 1B on an enlarged scale. The positions corresponding to $C_1$, $C_2$, $C_3$ and $C_4$ in FIG. 1B are indicated by the same symbols. The hatched portions are the opaque regions which have a high electrical conductivity and block the light. The portion $C_1$, $C_2$, $C_3$ and $C_4$ lying in the x direction has thin opaque strips are arranged in the x direction, while at the end portion $C_1$ to $C_2$, there is a thin opaque strip arranged in the y direction. In consequence, the polarization characteristics described above can be imparted to the transmitted light.

The reason is as follows. As is well known, when the opening width of a slit pattern is about as large as ½ of the wavelength, only the polarized light component in the direction of this slit passes through, and the polarized light component in the direction intersecting perpendicularly to the polarized light component in the slit direction is blocked. On the other hand, the line width of this light-transmitting portion is thinner than the limit of resolution of the projection optical system, so that an image of the minute structure within the pattern $l_2$ cannot be transferred to the resist layer by pattern exposure.

Figure 3A:
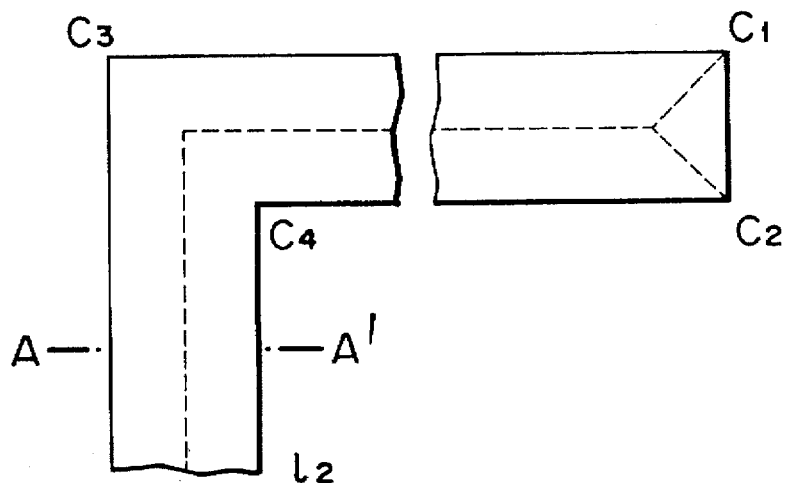
FIG. 3A is a plan view of the mask (or reticle) in the present invention.

FIG. 3A is an embodiment of the pattern-dependent polarizing pattern for imparting the polarization characteristics suitable for the direction of the pattern in FIGS. 1A and 1B to the pattern-transmitted light. As in FIG. 2, FIG. 3A shows only the pattern of $l_2$ of FIG. 1B on an enlarged scale, and the positions corresponding to $C_1$, $C_2$, $C_3$ and $C_4$ in FIG. 1B are designated by the same symbols.

Figure 3B:
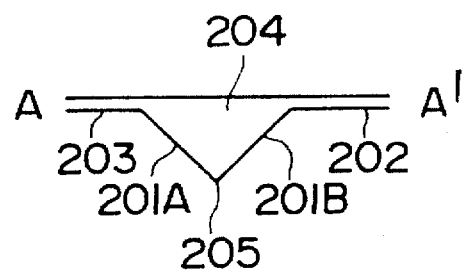
FIGS. 3B and 3C are sectional views taken along line A—A'.
Figure 3C:
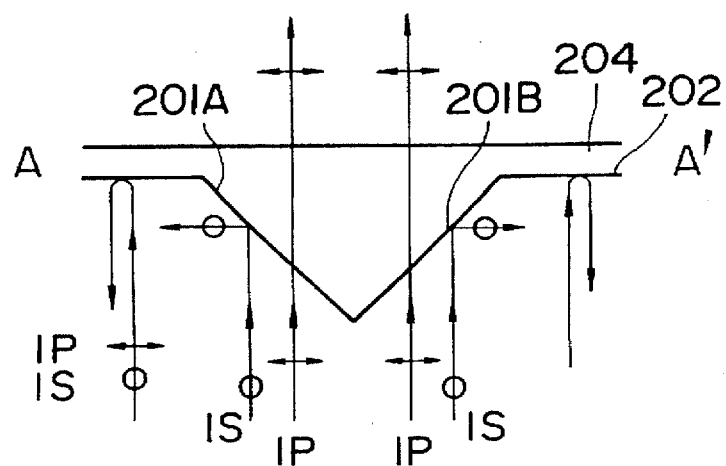
Figure 4A:
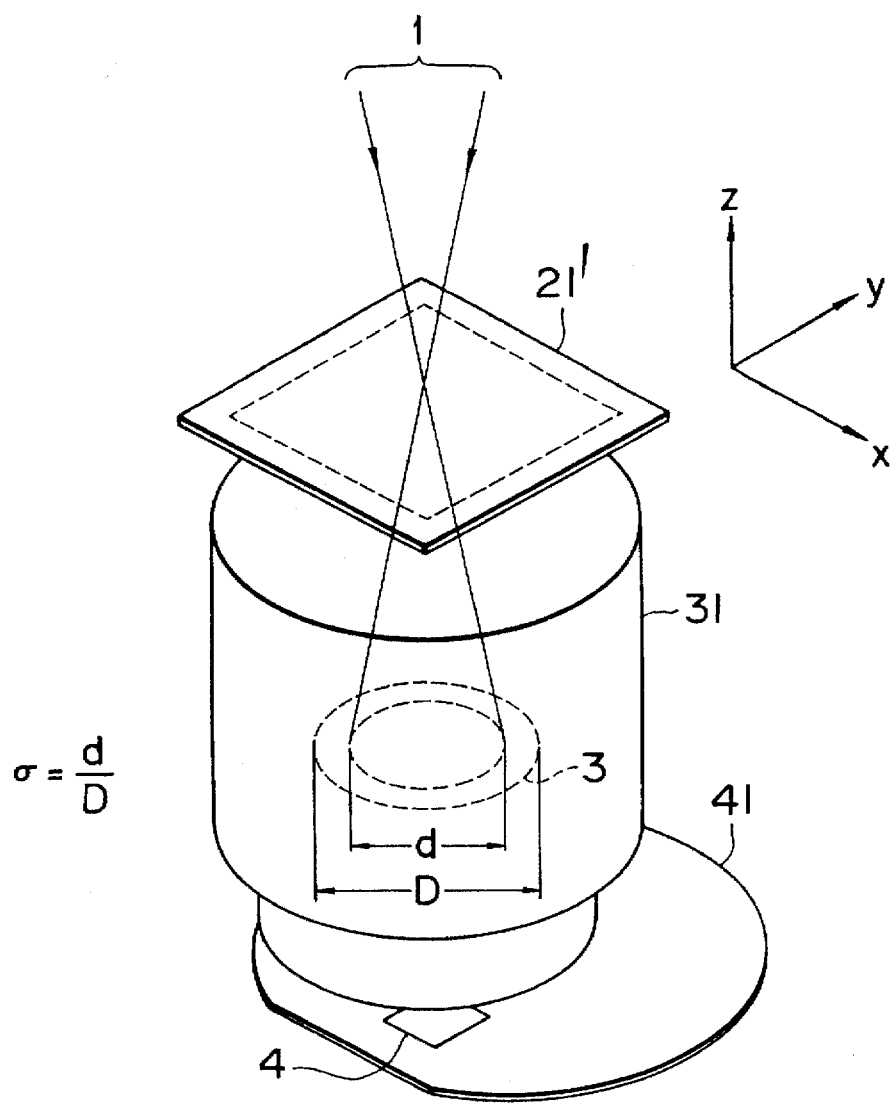
FIG. 4A is a perspective view of the illumination system of a conventional exposure apparatus.
Figure 4B:
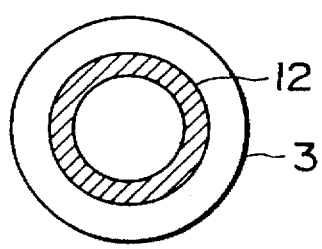
FIGS. 4B and 4C are views for showing states of illuminating lights in the apparatus of FIG. 4A.
Figure 4C:
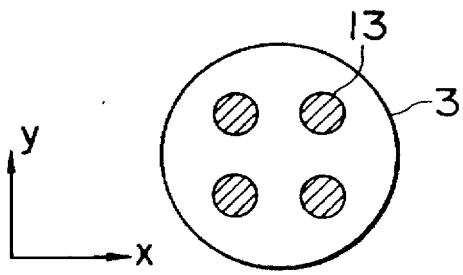

FIGS. 3B and 3C are sectional views taken along the line A—A' of FIG. 3A. Reference numeral 202 denotes a portion for blocking the light, and 203 denotes glass as the base of the mask. The portions for transmitting the light are inclined faces 201A and 201B. To the inclined face, a well-known coating used for a polarization beam splitter has been applied. On this coating, a transparent glass material has been applied to make the surface flat.

Under this structure, as is well known about the function of the polarization beam splitter, out of the light rays incident on the transmission portion, only the light rays 1P of the p-polarized light pass through it, but the light rays is of the s-polarized light do not pass through it as shown in FIG. 3C. As a result, only the polarized light rays intersecting perpendicularly to the direction of the pattern pass, and at the end portion $C_1$ to $C_2$, the polarized light rays intersecting perpendicularly to the direction of the edge of the pattern pass therethrough. In this embodiment, with regard to the polarized light rays on the pupil of the projection optical system, as shown in FIGS. 11A and 11B, the illumination light is previously made to have polarized light rays intersecting perpendicularly to the polarized light rays shown in FIGS. 1A, 1B, and 5A.

Figure 5A:
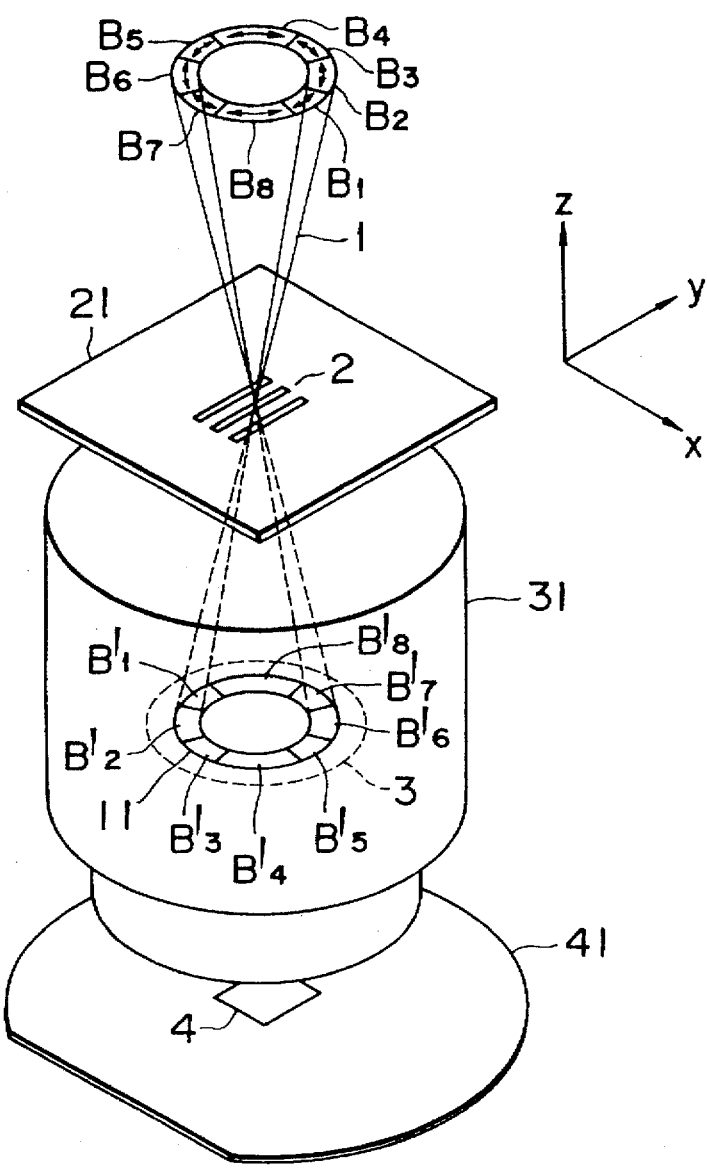
FIG. 5A is a perspective view of the illumination system of a pattern exposure apparatus in the present invention.
Figure 9A:
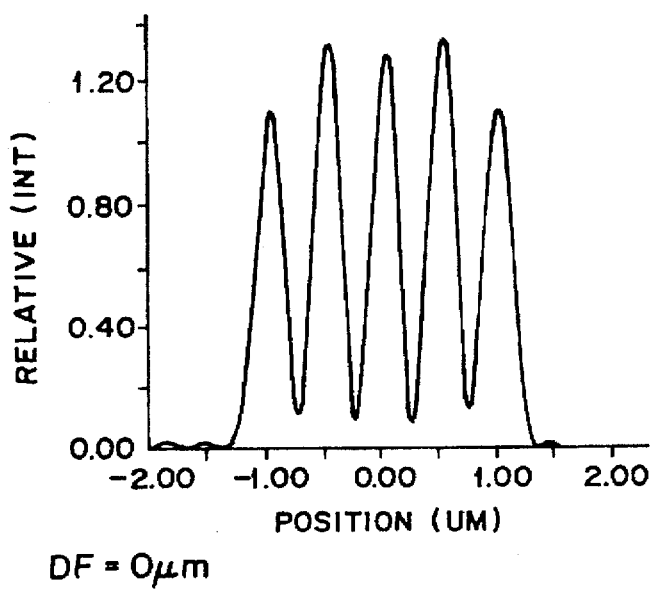
FIGS. 9A, 9B and 9C are graphs showing the states of resolution of a resolution pattern, obtainable by an exposure method in the present invention.
Figure 9B:
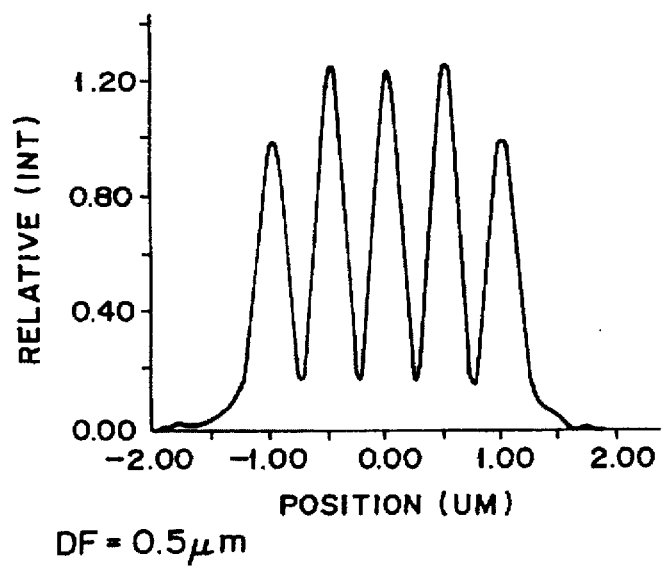
Figure 9C:
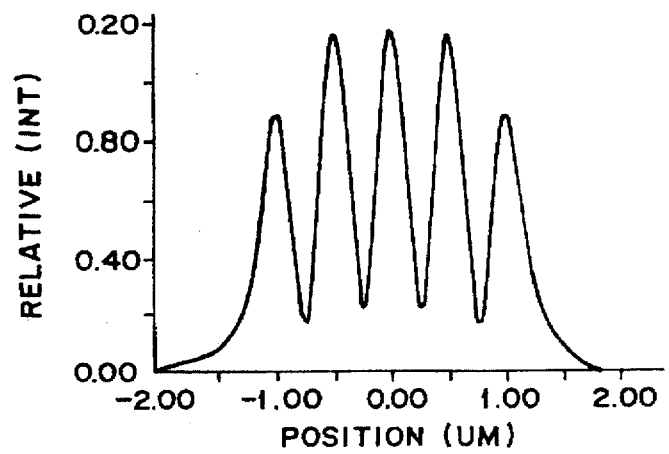

Using the mask in FIGS. 2 and 3A, 3B and 3C, the illuminating light whose polarization would be almost rotationally symmetric with regard to the center of the pupil of the projection optical system as shown in FIGS. 1A, 5A and 11A if the mask were not used is irradiated to the pupil. For example, the wavelength is that of the i line ($\lambda$=365 nm) of a mercury lamp, the numerical aperture NA of the projection optical system is set at 0.57, and the width of the exposure pattern is set at 0.25 µm. The reduction ratio of the projection optical system is set at ⅕. Since the pattern on the mask is five times the exposure pattern, the width of the slit without pattern in FIG. 2 is about 0.18 to 0.2 µm, which is ½ of the wavelength as mentioned above. As a result, the polarized light rays in the same direction as the direction of the pattern passes through the mask, so that as described with reference to FIGS. 9A, 9B and 9C, a higher resolution can be obtained than in the prior art shown in FIGS. 6A to 8C.

Figure 10A:
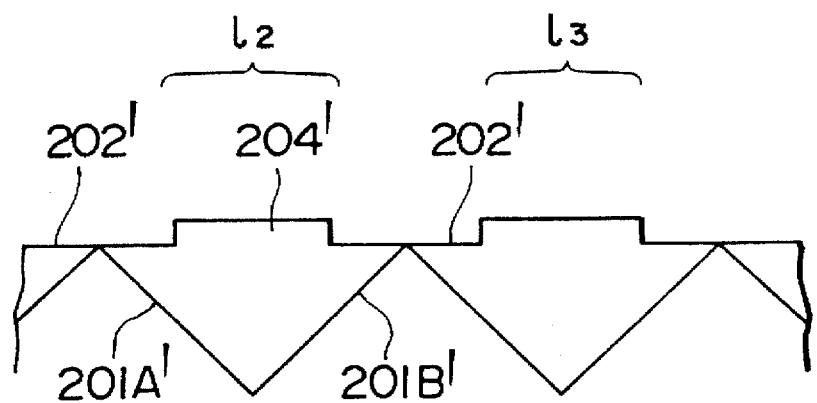
FIG. 10A is a sectional view of a mask (or reticle) in the present invention.

The embodiment of the present invention will be described with reference to FIGS. 10A and 10B. FIG. 10A is a sectional view of the surface region of the mask. For example, $l_2$ and $l_3$ correspond to the patterns $l_2$ and $l_3$ of the mask in FIGS. 1A and 1B. In this embodiment, the opaque regions 202' do not completely block the light, but allow the light to pass a little. As shown in the illustration, the inclined faces 201A' and 201B' performing the function of a polarization beam splitter described with reference to FIGS. 3A to 3C are present at the opaque regions 202' which allow the light to pass a little. By this structure, out of the light rays passing through this portion of the mask, both the transparent and opaque regions transmit only the p-polarized light rays, but block the s-polarized light rays completely. In other words, only the polarized light rays in the direction perpendicularly intersecting the direction of the pattern (the direction perpendicular to the plane of the paper) are transmitted.

Figure 10B:
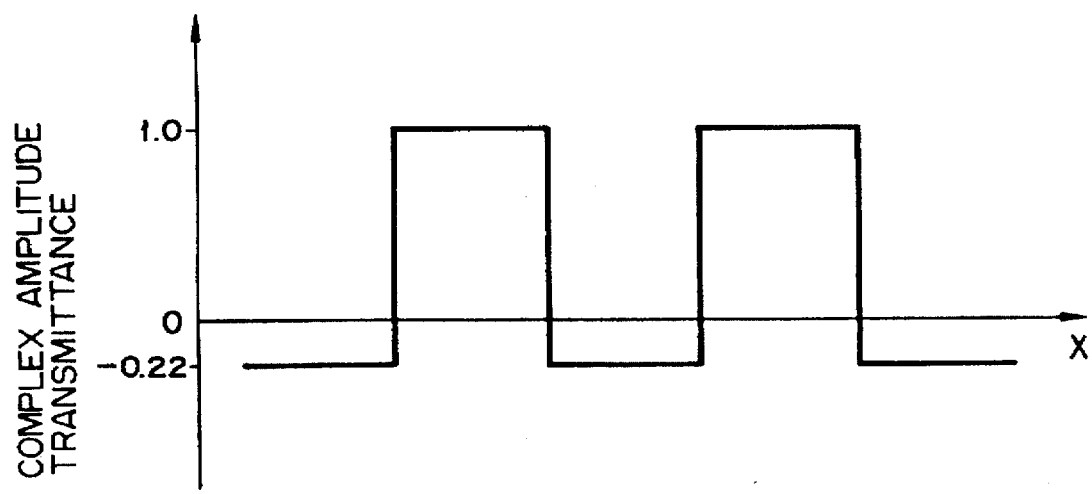
FIG. 10B is a diagram showing the complex amplitude transmittance of this mask.
Figure 12A:
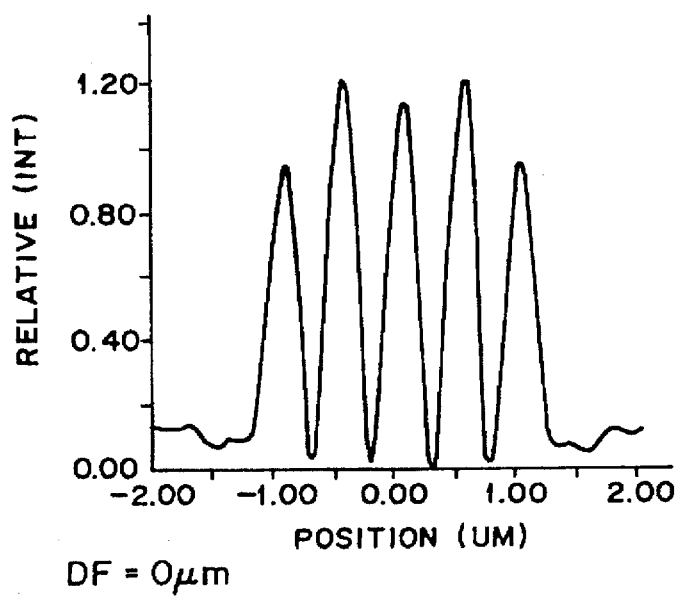
FIGS. 12A, 12B and 12C are diagrams showing the states of resolution of a resolution pattern, obtainable using means in FIGS. 10A, 10B, 11A and 11B.
Figure 12B:
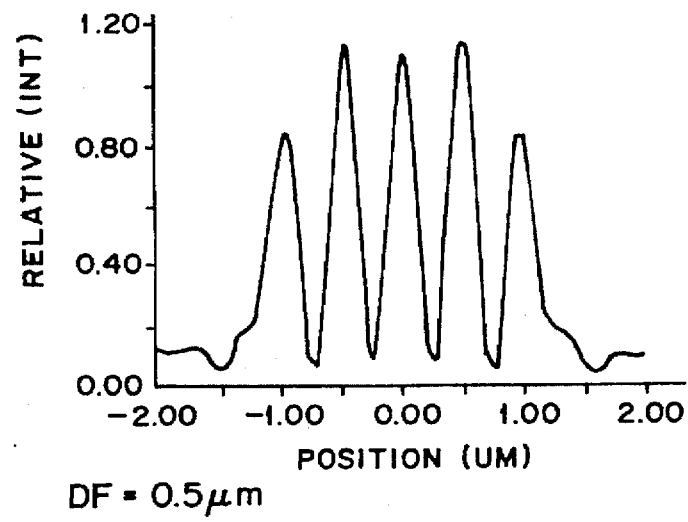
Figure 12C:
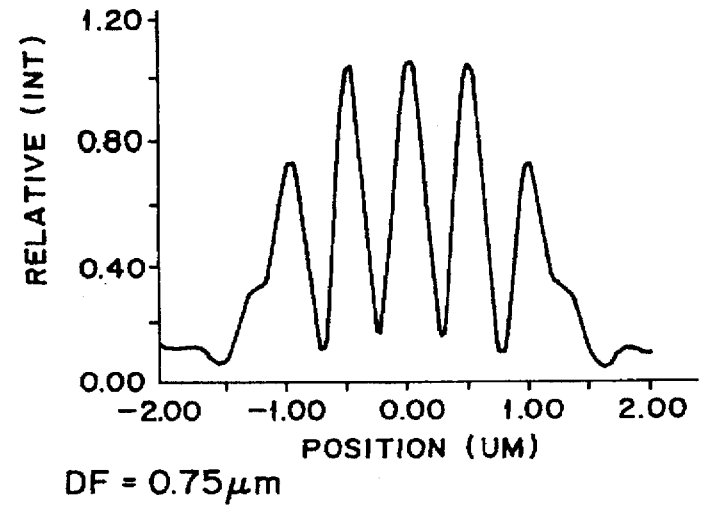

The pattern-transmitted light rays in this state of polarization have the amplitude transmittance shown in FIG. 10B. To be more specific, supposing that the amplitude transmittance of the light-transmitting region of the pattern is 1, that of the opaque region is −0.22 (in other words, the opaque region has the amplitude transmittance of 22% and 180° out of phase with the light-transmitting region). When the mask is irradiated with the illuminating light having the directivity and the polarization characteristics shown in FIG. 11A, as mentioned above, only the polarized light perpendicular to the edge of the patter is transmitted, the diffracted light expands in a wide range passing through the center of the pupil of the lens, the high frequency component of the pattern passes through the pupil, so that a pattern with a high resolution can be transferred by exposure as shown in FIGS. 12A to 12C.

As shown in FIG. 11B, the object of the present invention can be achieved by setting the illuminating light in the unpolarized state and arranging on the pupil of the lens a polarizer (analyzer) 33 which transmits polarized light rays radial to the optical axis of the lens, which will be described in detail later with reference to FIG. 14.

Figure 13A:
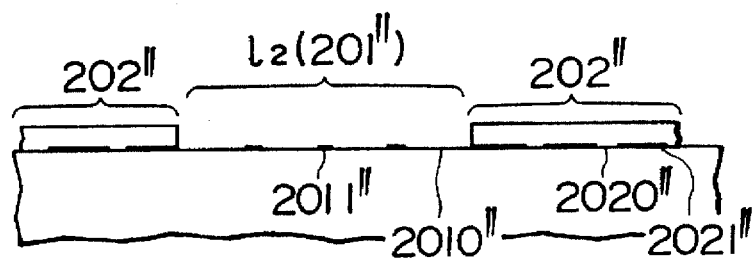
FIG. 13A is a sectional view of a mask in the present invention.
Figure 13B:
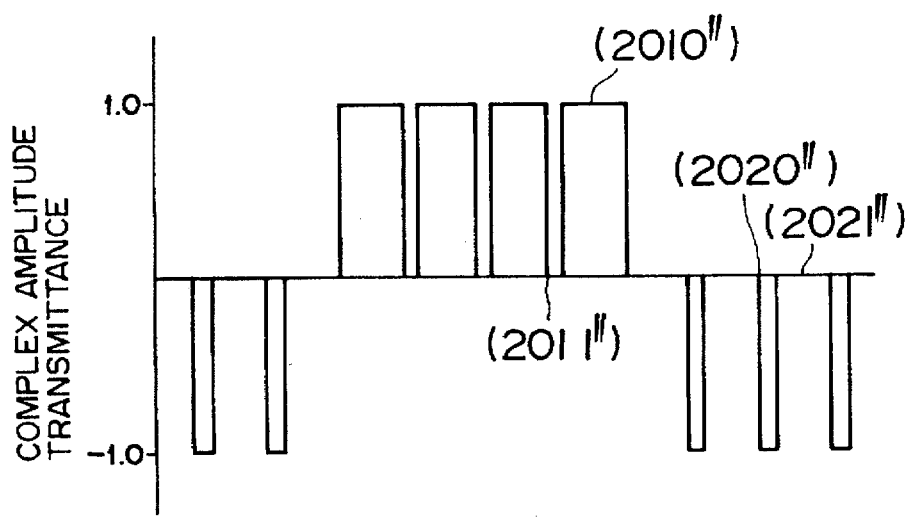
FIG. 13B is a diagram showing the complex amplitude transmittance of the mask.
Figure 13C:
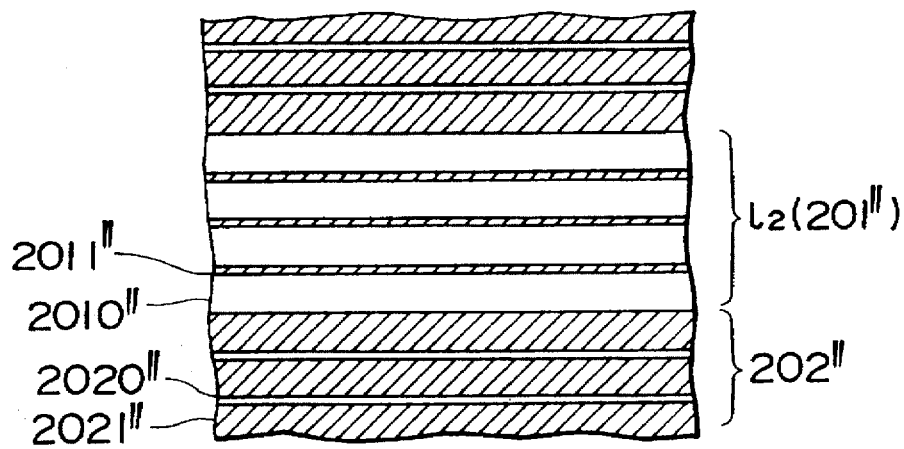
FIG. 13C is a plan view of the mask.

FIGS. 13A to 13C show an embodiment of the present invention. FIG. 13A is a sectional view of the mask in the present invention, and FIG. 13B shows the complex amplitude transmittance of the transmitted rays of the illuminating light incident on the mask from the lower position of FIG. 13A upward. FIG. 13C is a plan view of this mask, in which the hatched regions are opaque to light, while the unhatched regions are transparent to light. In FIG. 13A, the section $l_2$ is the portion of the pattern which transmits the light, and in this region there is at least one opaque region 2011" having electrical conductivity described with reference to FIG. 2. The number of these opaque regions is selected such that the width of the light-transmitting region 2010" is about ½ of the wavelength.

In this embodiment, in contrast to the embodiment in FIG. 2, in the "0" region in the pattern, or the non-exposure region, the light-transmitting regions 2020" are provided between the light-blocking regions 2021". In addition, in the "0" region of the pattern, a phase shifter 202" for substantially 180° is provided. Consequently, the complex amplitude of the light just after it has passed through this mask is as shown in FIG. 13B. The intensity component ratio of the transmitted light rays of the "1" region 201" and the "0" region 202" of the pattern when the light rays pass through the pupil of the lens are set at 1 to $0.22^2$.

Under this condition, the polarized light rays in the edge directions of the pattern are transmitted simultaneously, and if unpolarized illuminating light is irradiated to the mask as shown in FIG. 14, for example, only the polarized light rays oscillating in the direction of the edges of the pattern on the mask pass through the mask. For this reason, as shown in FIG. 14, a polarizing element 33 whose state of polarization is almost rotationally symmetric with respect to the center of the pupil is arranged on the pupil of the lens. By this arrangement, the light passing through the pattern becomes polarized light rays oscillating in the edge directions, and out of the pattern-transmitted light rays, the light rays diffracted in the direction of passing through the center of the pupil pass through the polarizing element 33 (To be more precise, the further away from the center of the pupil the place where the light diffracted at the edge of the pattern goes, the smaller the proportion of the light passing through the polarizing element 33 becomes.)

As a result, like in the embodiments in FIGS. 10A, 10B, 11A and 11B, the resolution as shown in FIGS. 12A to 12C can be obtained, so that the pattern with a high resolution for excellent separation of the patterns can be transferred to the resist. The object of the present invention can be achieved by arranging parts $P_0, P_1, P_2, \ldots, P_n$ of the polarizing element 33 which transmit the polarized light rays oscillating in fixed directions, as shown in FIG. 14, so that the state of polarization becomes about rotationally symmetric with respect to the center of the pupil.

In the embodiments in FIGS. 10A, 10B, 11A, 11B, 13A, 13B and 14, the section whose complex amplitude transmittance is 22% of 1.0 for the "1" region (exposure region) is referred to as the "0" region (non-exposure region) of the pattern but the present invention is not necessarily limited to the above value in achieving the object of the present invention. It is only required that the complex amplitude transmittance is less than about 30% so that noise by leak of light in the nonexposure region (noise by leak of light which occurs at the "0" region outside the repetitive pattern in FIG. 12) should be at the level of the "0" region (non-exposure region) between the repetitive patterns.

If in the embodiments in FIGS. 10A, 10B, 13A to 13C the transmittance in the non-exposure regions other than the surrounding areas of the regions which transmit light substantially 100% is not limited to the 22% or 30% mentioned above but reduced to a complete shielding, that is, 0%, even slight fogging of the resist by leak of light in the regions other than the pattern section can be eliminated, making it possible to produce highly reliable integrated circuits.

Figure 5B:
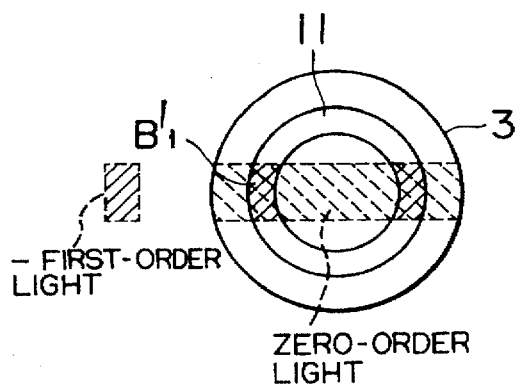
FIG. 5B is a state of diffraction of the illumination.
Figure 5C:
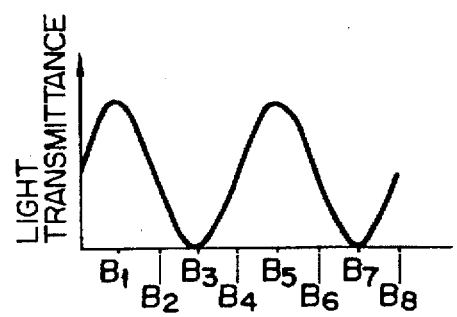
FIG. 5C is a diagram showing the light transmittance of the mask pattern.
Figure 6A:
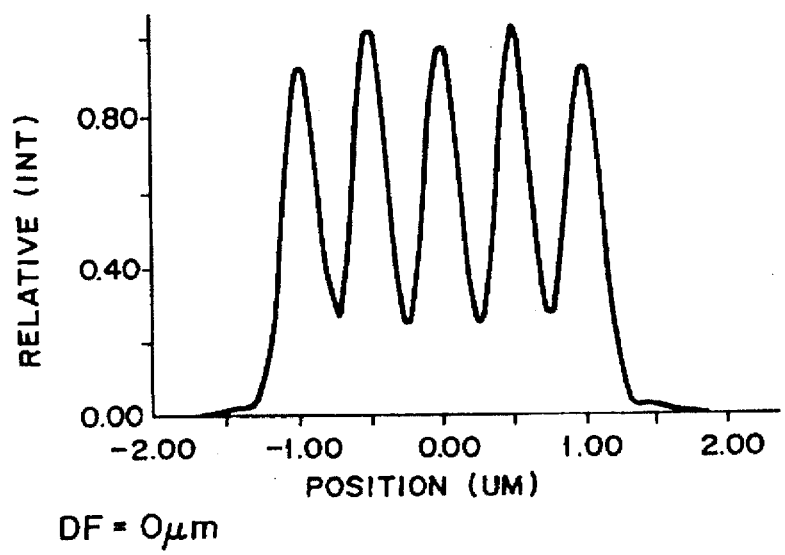
FIGS. 6A, 6B and 6C are graphs showing the states of resolution of a pattern, obtainable by conventional ring zone illumination.
Figure 6B:
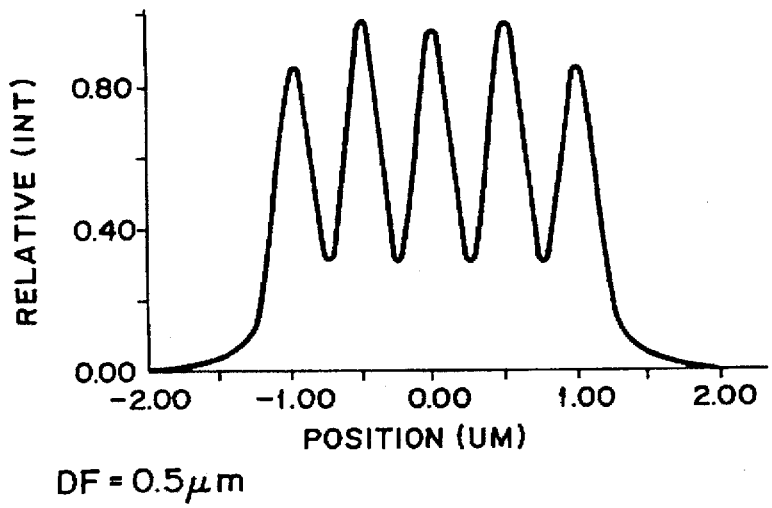
Figure 6C:
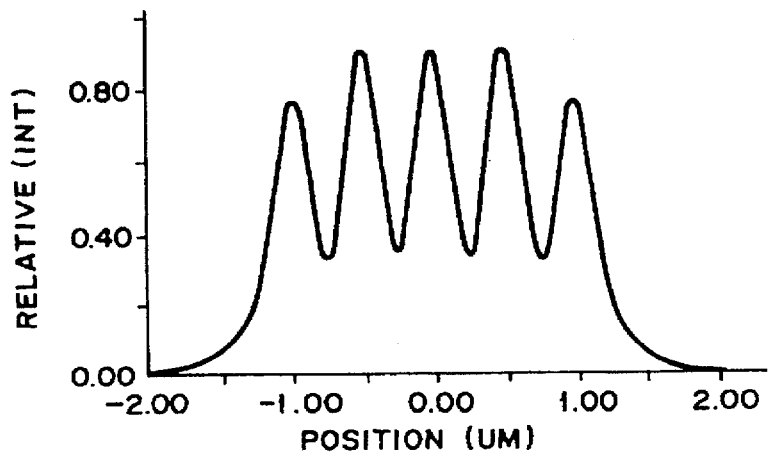
Figure 7A:
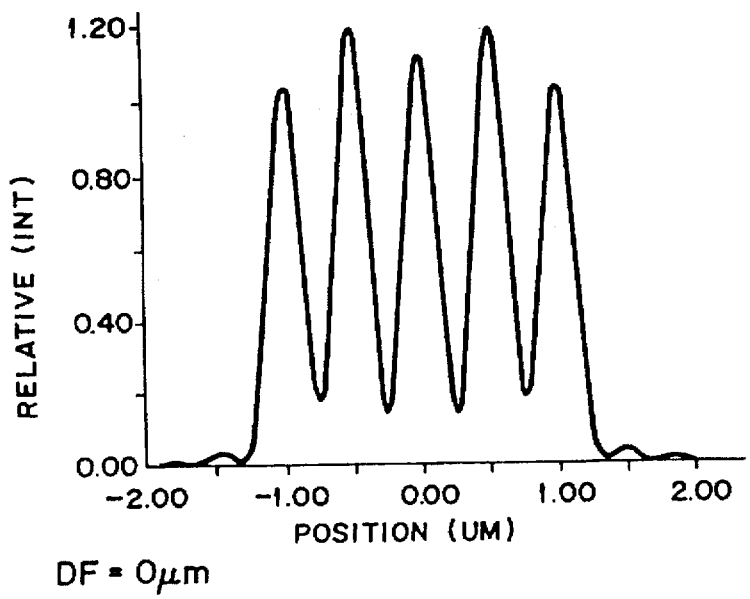
FIGS. 7A, 7B and 7C are graphs showing the states of resolution of a pattern in the x and y directions by oblique incident exposure from directions at 45° from the x and y axes in the prior art.
Figure 7B:
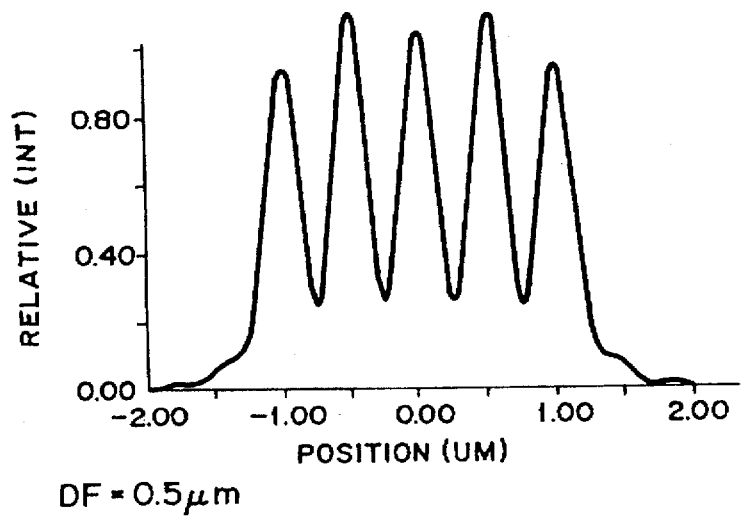
Figure 7C:
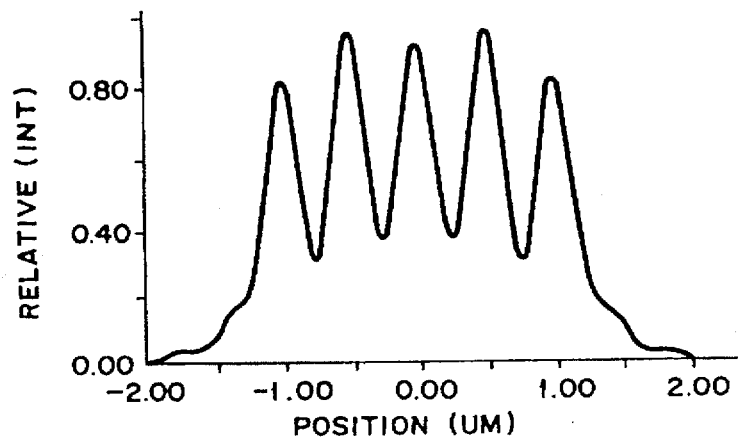
Figure 8A:
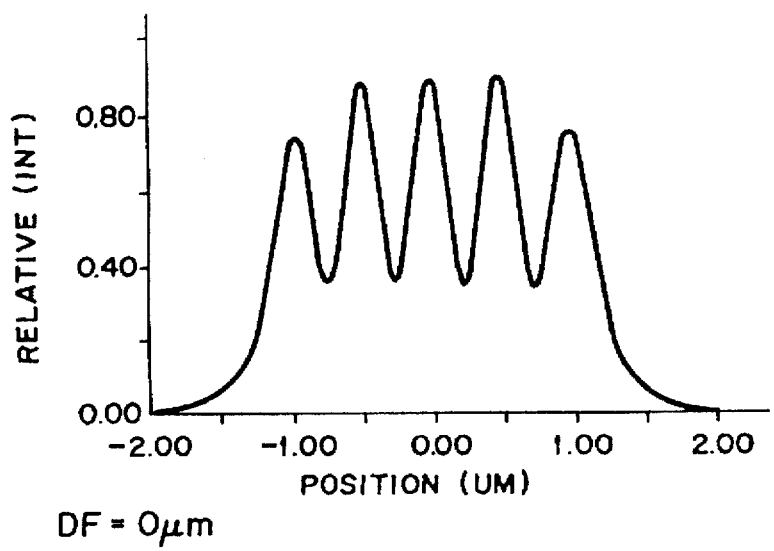
FIGS. 8A, 8B and 8C are graphs showing the states of resolution of a pattern lying at 45° from the x and y directions by oblique incident exposure from directions at 45° from the x and y axes in the prior art.
Figure 8B:
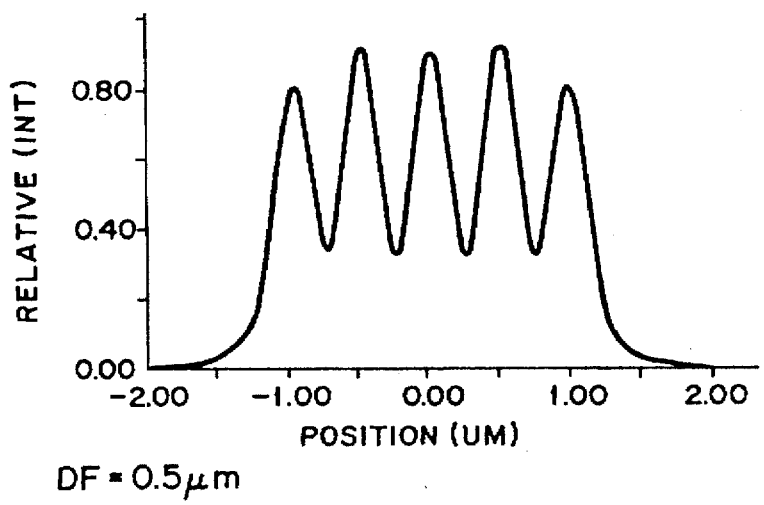
Figure 8C:
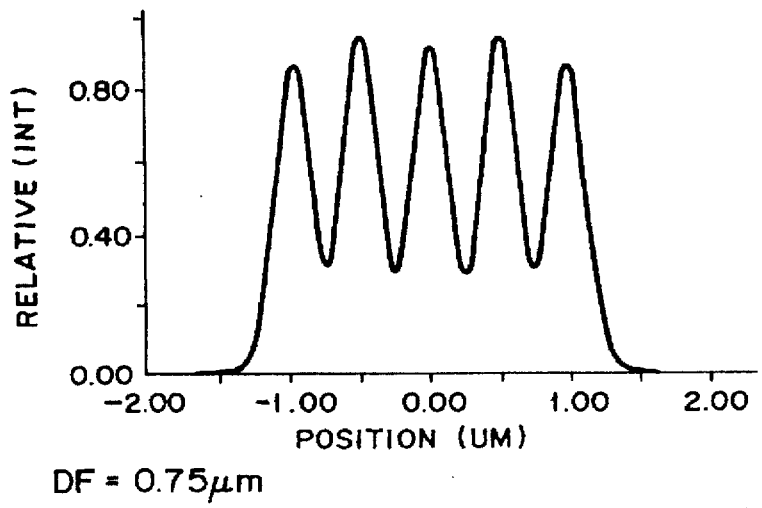
Figure 15:
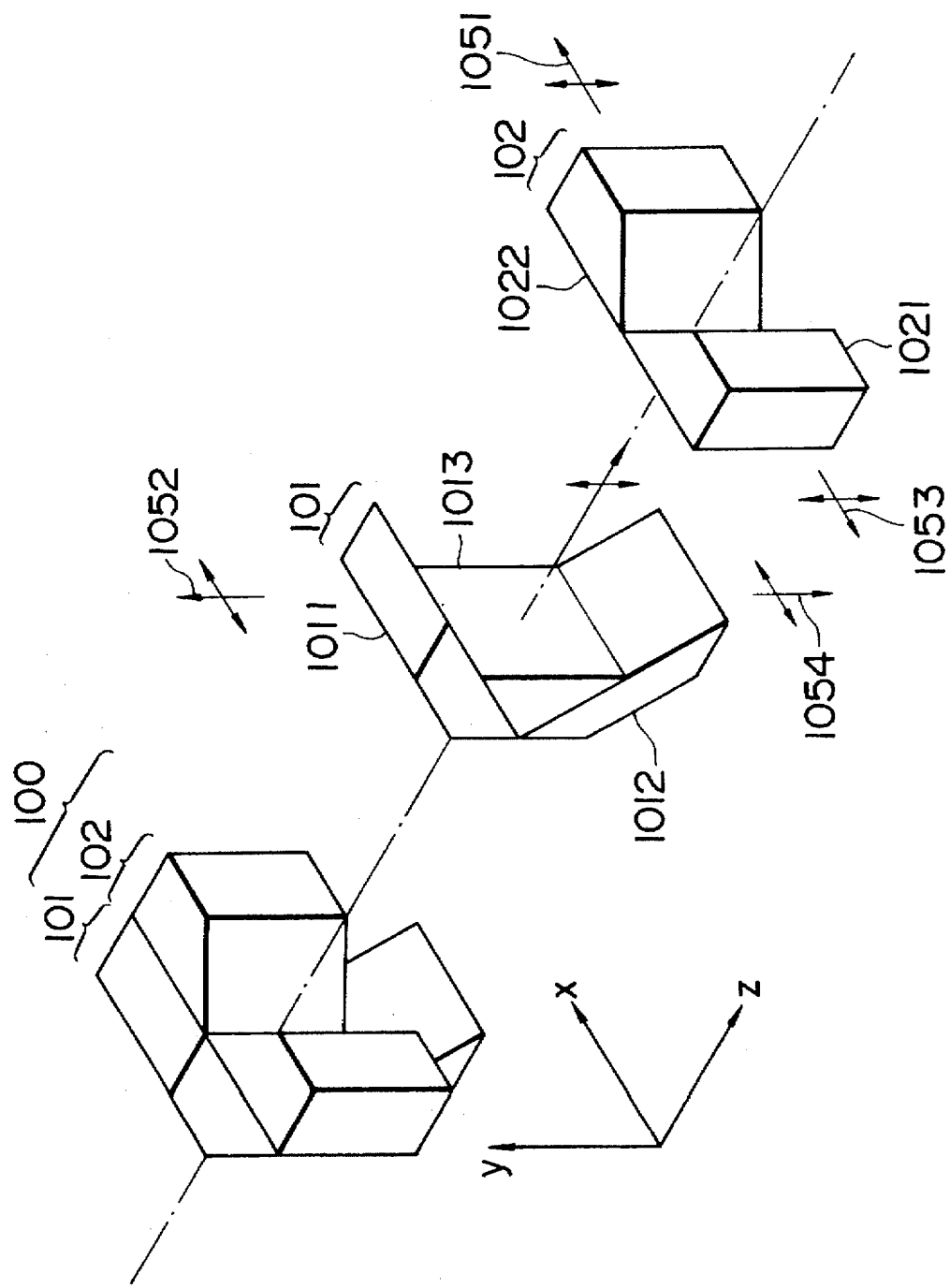
FIG. 15 is a perspective view of the illumination system used in the optical apparatus in the present invention.
Figure 16B:
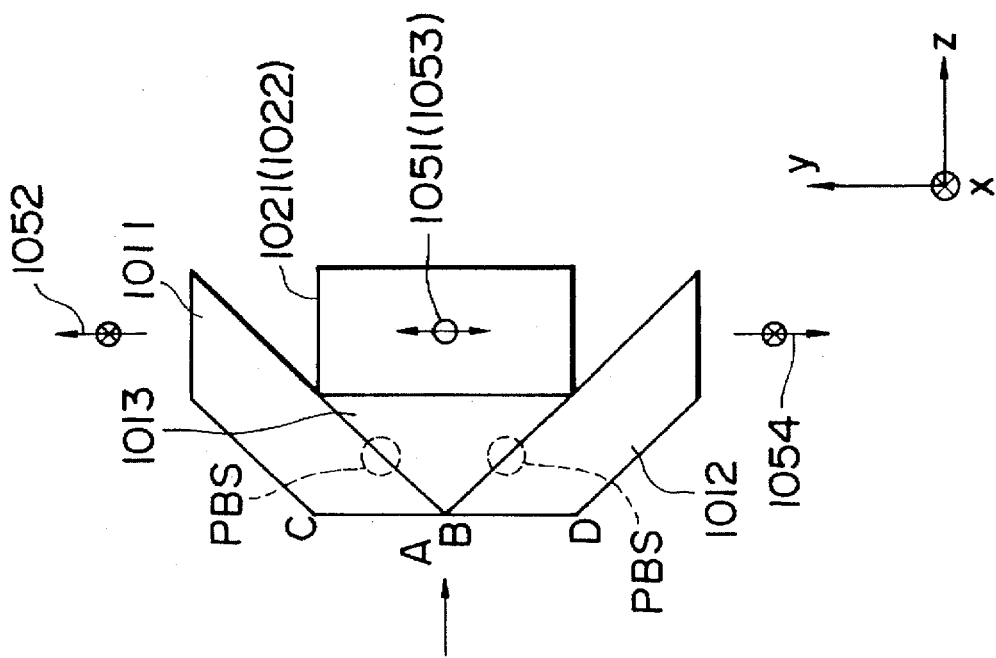
FIGS. 16A and 16B are front and side views of the illumination system used in the exposure apparatus in the present invention.
Figure 16A:
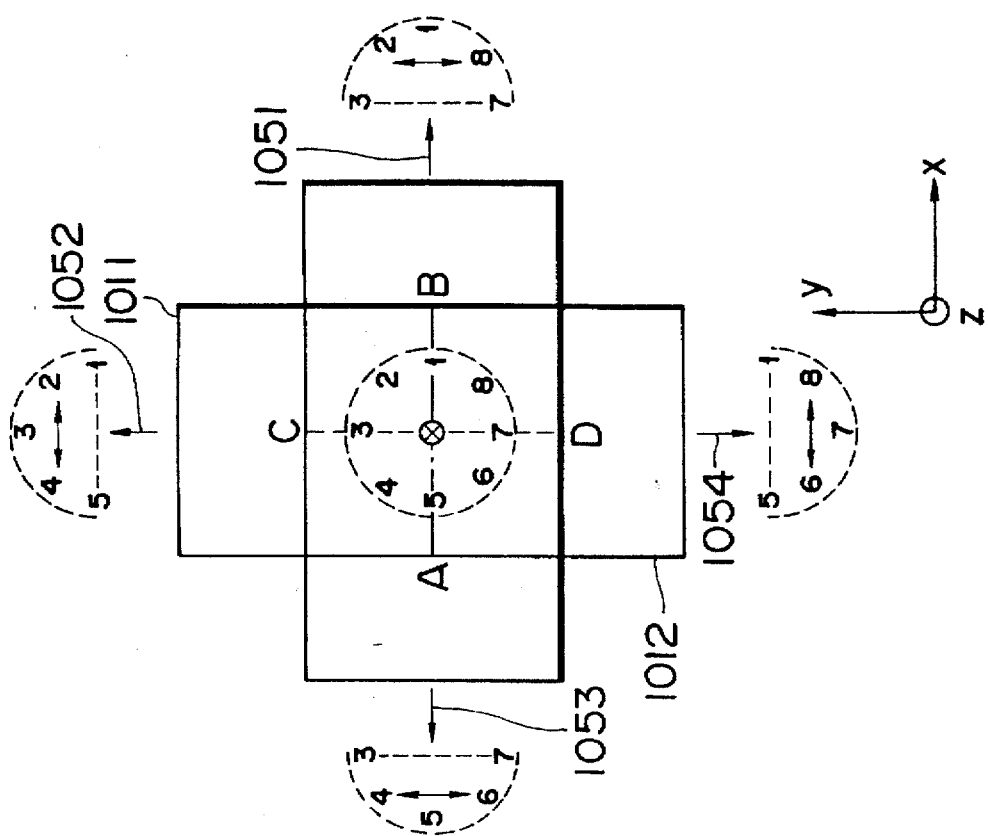
Figure 17:
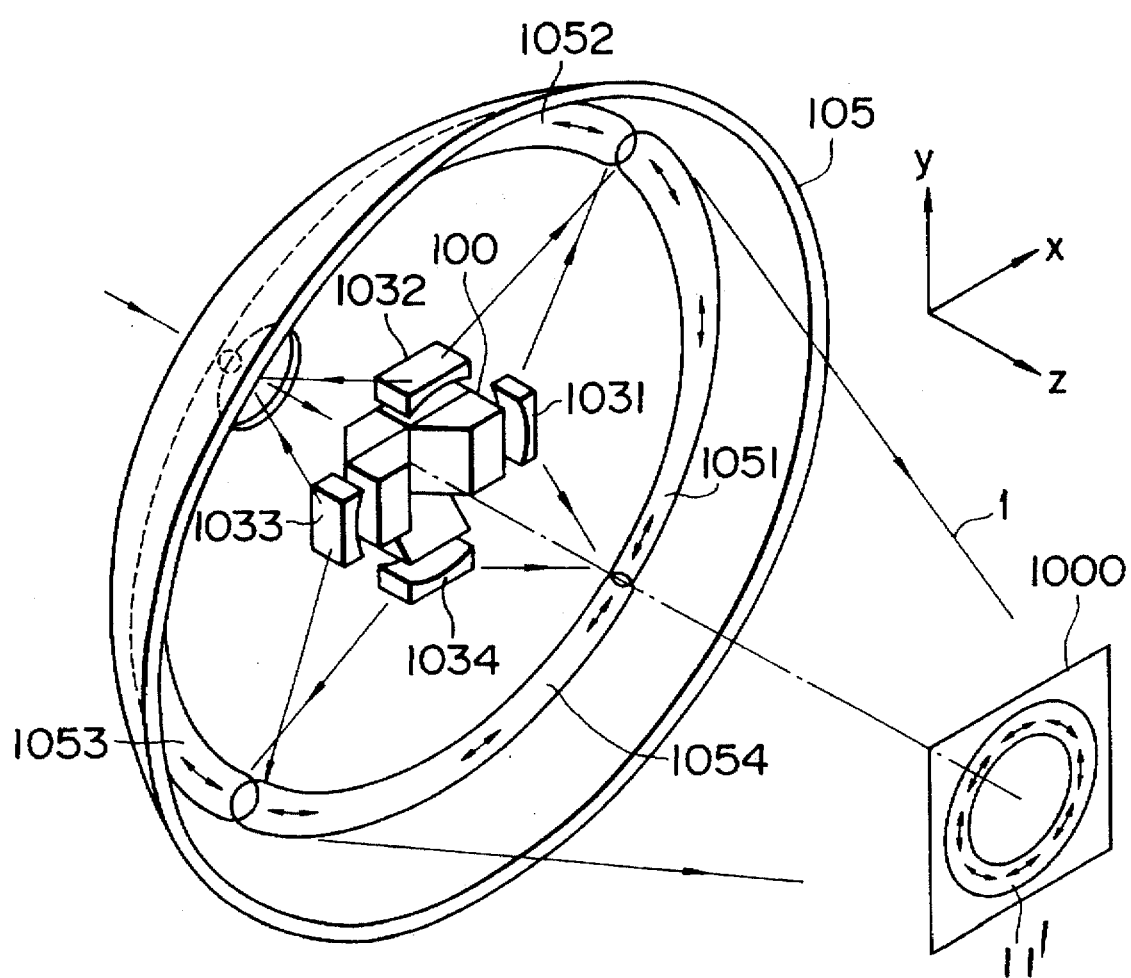
FIG. 17 is a perspective view of the illumination system used in the exposure apparatus in the present invention.
Figure 20:
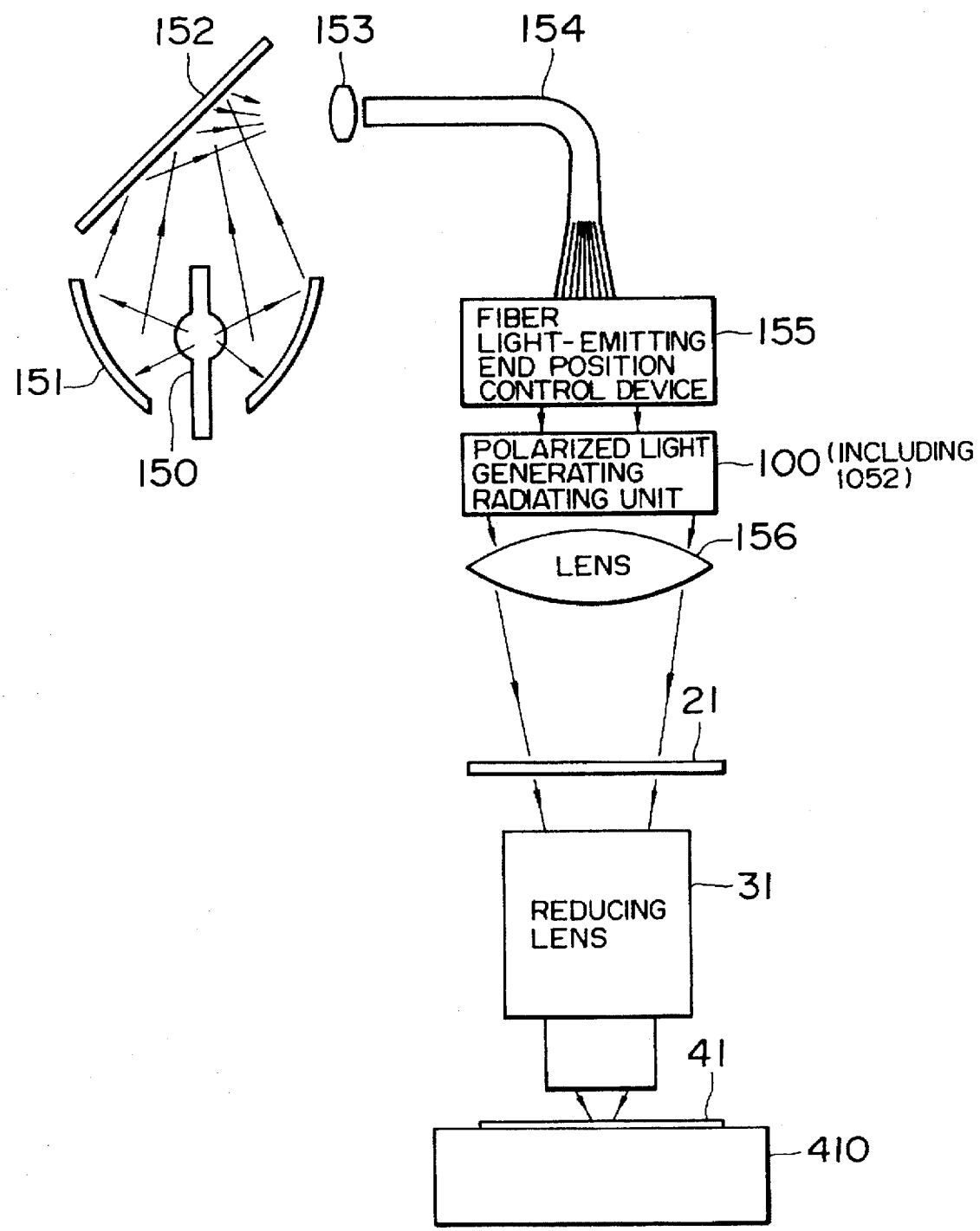
FIG. 20 is a plan view of the exposure apparatus in the present invention.

Referring to FIGS. 15 to 17, description will now be made of an embodiment of the ring-shaped, rotationally symmetric polarized light illuminating means for realizing an illuminating light whose state of polarization on the pupil of the projection optical system in the embodiment of FIG. 5 is rotationally symmetric with respect to the center of the pupil. FIG. 17 shows a general construction of the ring-shaped, rotationally symmetric polarized illuminating means. The light rays emitted by a mercury lamp are made incident efficiently on the illuminating means by a method using a well-known ellipsoidal mirror (FIG. 20). The injected light rays enter polarized light generating and radiating means 100.

The polarized light generating and radiating means 100 is constructed as shown in FIGS. 15, 16A and 16B. In the perspective view of FIG. 15, at the upper left is a general view of the polarized light generating and radiating means 100, and in the middle and at the lower right are two component pieces constituting the polarized light generating and radiating means 100. Reference numeral 101 denotes a polarization beam splitter (PBS) comprising 1011, 1012, and 1013. When light is incident on the surface of the PBS, the p-polarized light is transmitted straight, but the s-polarized light is reflected.

In consequence, as shown in FIG. 15, the light passing through the prism 101 and advancing in the z direction becomes a linearly polarized light polarized in the y direction, and out of the light reflected by the prism 101, the upper half advances upward along the y axis, and the lower half advances downward, but similarly along the y axis. The polarized light advancing upward and downward is the linearly polarized light oscillating in the x direction. The light passing through the prism 101 enters the prism 102 is totally reflected by the inclined faces and becomes the light advancing in +x directions.

The light advancing in ±x directions is the linearly polarized light oscillating in the y direction. In other words, the polarized light generating and radiating means 100 reflects the incident light radially (±x and ±y directions) as shown in FIGS. 16A and 16B, and makes the respective polarized light rays rotationally symmetric with respect to the optical axis of the light incident on the prism 100. The light radiating in four directions from the polarized light generating and radiating means 100 are made by cylindrical lenses 1031, 1032, 1033 and 1034 into sector type divergent rays 1051, 1052, 1053 and 1054 incident on a quadratic surface mirror 105 as shown in FIG. 17.

The source of the divergent rays is practically close to the optical axis. By this arrangement, the light reflected by the quadratic surface mirror 105, if a screen 1000 as shown in FIG. 17, for example, is placed, illumination can be realized which is converged in a ring shape on this screen, and which has the linearly polarized light characteristics of rotation symmetry as shown in FIG. 5.

In order to realize the radial linearly polarized light, it is only necessary to rotate by 90° the polarization direction of the linearly polarized light radially emitted from the above-mentioned polarized light generating and radiating means by using a half-wave plate. The polarized light generating and radiating means 100 of the illumination system described with reference to FIGS. 15 to 17 separates and diverges the light in four directions, but the light may be separated and diverged in six or eight directions.

Figure 18B:
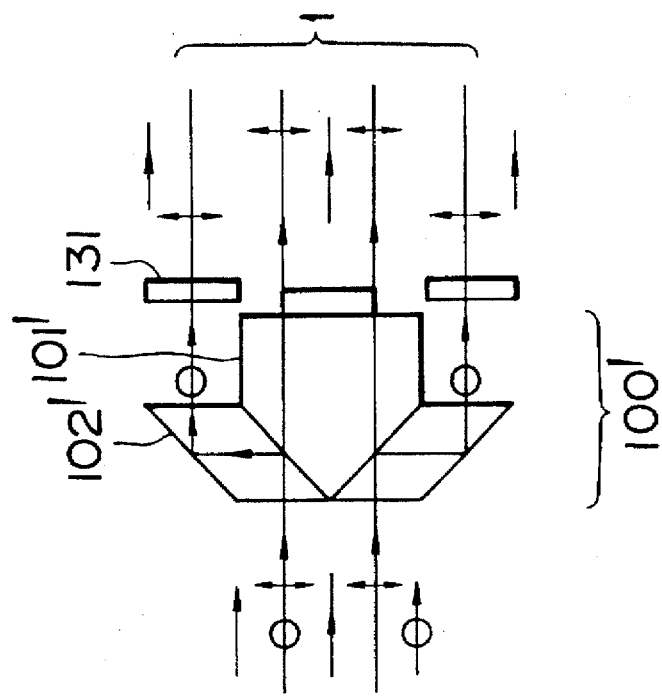
FIGS. 18A and 18B are respectively a perspective view and a side view of the illumination system switchable between ordinary illumination, ring zone illumination or the like of the exposure apparatus in the present invention.
Figure 18A:
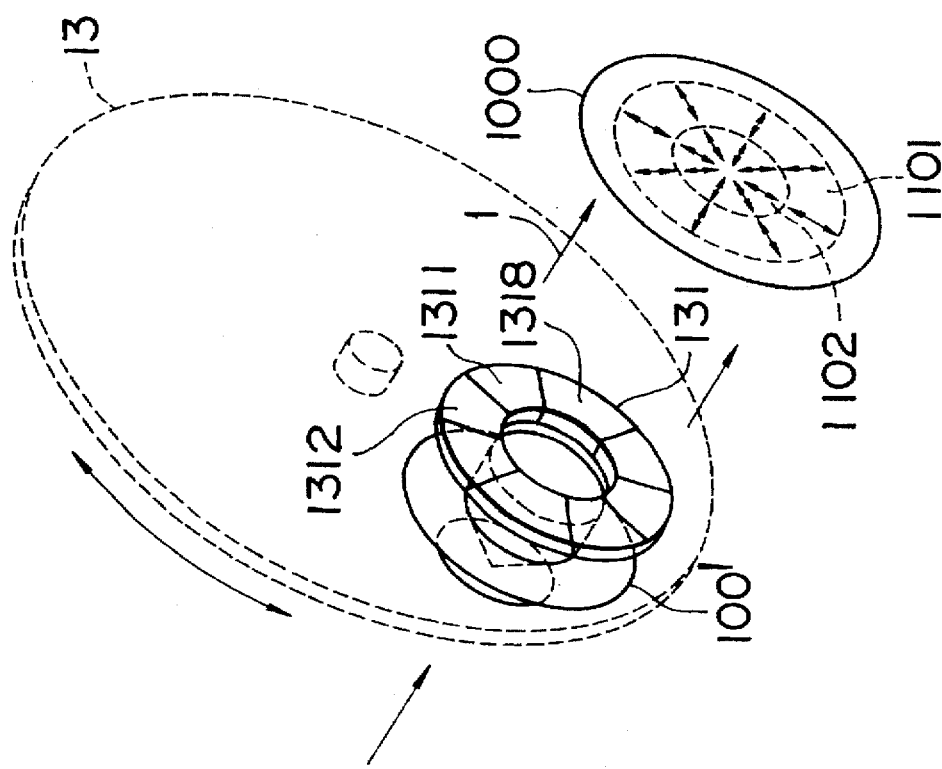

FIGS. 18A and 18B are diagrams for showing an embodiment of the exposure method in the present invention. In this embodiment, by using a reflecting face of the PBS formed in a conical shape, a continuous and uniform illumination is made possible. FIG. 18A is a perspective view, while FIG. 18B is a sectional view. A conical body 101' has its conical face serving as a polarization beam splitter. An exposure light, which is a randomly polarized light, incident on this conical face passes the axis of the cone. As is understood from the state of spread and polarization of light 1102 on the screen 1000 in FIG. 18A, the linearly polarized light polarized radially from the axis passes through the PBS.

On the other hand, the polarized light perpendicularly intersecting the above polarized light is totally reflected by a conical prism 102'. Immediately after passing through the conical prism 102', this light has its polarization direction perpendicularly intersecting that of the light 1102, but as it passes through the half-wave plate 131, its polarization direction is turned 90° and the light becomes a radially polarized light as indicated by 1101. A total of eight half-wave plates are provided such that the axes of the crystal plates constituting the half-wave plate are turned 45° each for the plates 1311, 1312, 1313, . . . . By this arrangement, the illuminating light becomes a linearly polarized light in the radial direction in any part of it.

In the embodiment in FIGS. 18A and 18B, incoherent illumination is produced with little directivity of the light. Even when such incoherent illumination is used, because the light with directivity reducing the resolution is cut by use of the mask in FIGS. 3A to 3C, patterns with high resolution unobtainable with the conventional exposure methods can be transferred to the wafer at the exposure step.

Figure 19A:
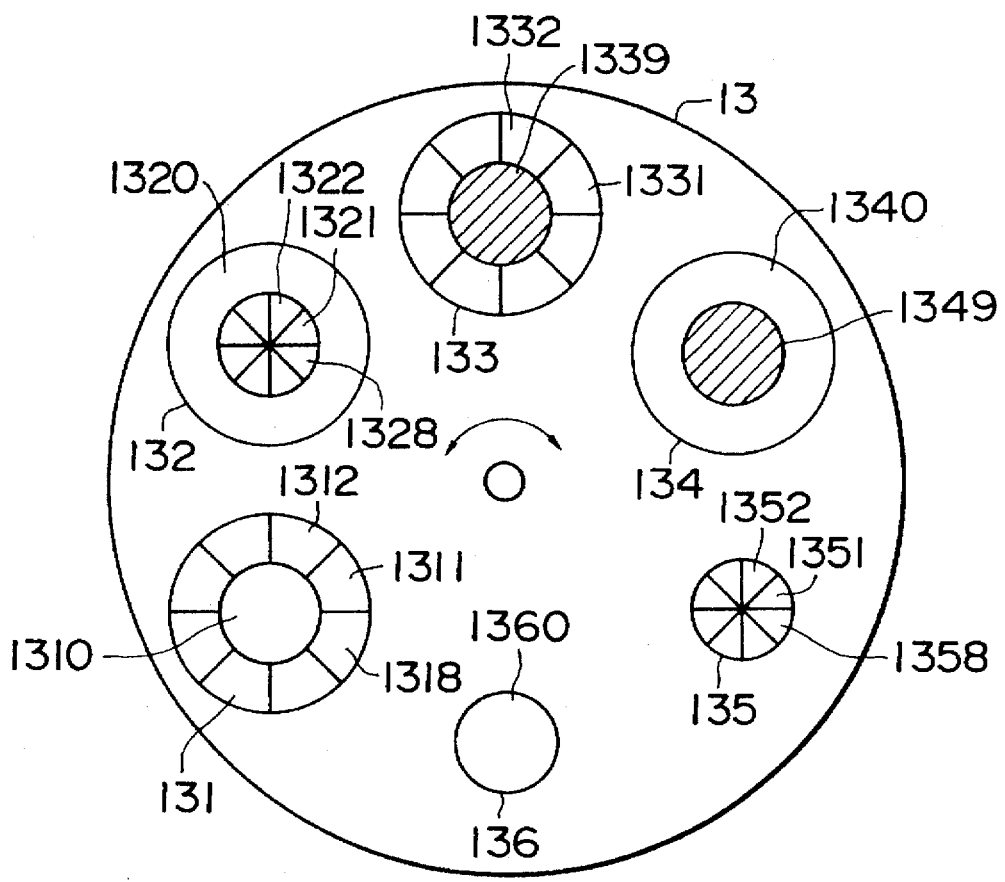
FIGS. 19A to 19G are front views of the switching means of the illumination system of the exposure apparatus in FIGS. 18A and 18B.
Figure 19B:
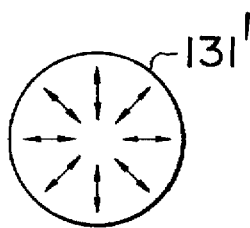
Figure 19C:
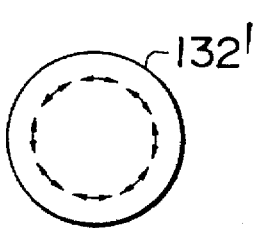
Figure 19D:
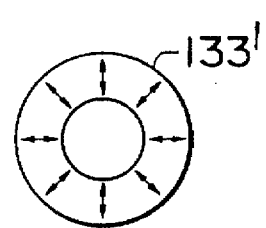
Figure 19E:
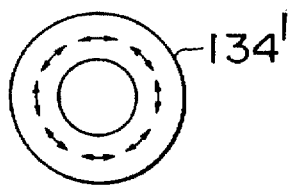
Figure 19F:
Figure 19G:

FIGS. 19A to 19G show an embodiment of the present invention. For some patterns used, ring zone illumination is not necessarily required, but ordinary illumination is sometimes more preferable. FIGS. 19A to 19C show an illumination system of the pattern exposure apparatus for use in such a case. The eight half-wave plates arranged radially in FIG. 18A are located on the rotary disc 13. As shown in FIG. 19A, the rotary disc has six different types of half-waves arranged along the peripheral area on the disc, and by rotating the disc, ordinary illumination or ring zone illumination can be realized which has the polarization characteristics that the state of polarization is almost rotationally symmetric with respect to the center of the pupil.

As shown in FIGS. 19A to 19G, by selecting the half-wave plates 131, 132, 133, . . . 136, ordinary illumination and ring zone illumination can be achieved which have polarized light rays shown in FIGS. 19B, 19C, . . . 19G.

FIG. 20 shows an embodiment of the exposure apparatus according to the present invention. The light emitted from a mercury lamp 150 is reflected by ellipsoidal mirrors 151, then reflected by a mirror 152, and after passing through a lens 153, the light enters a bundle of fibers 154. The light-emitting ends of the fibers are located in a fiber light-emitting end position control device 155, where a plurality of small fiber bundles, separated finely, are distributed with desired spacing to obtain a desired directivity of illumination.

The light with a desired state of its spread passes through the polarized light generating and radiating means 100 and the quadratic surface mirror 105 described in FIGS. 15 to 17, and illuminates the reticle 21 by means of a condenser lens 156. Since the reticle 21 is a pattern-dependent polarizing mask shown in FIG. 2 and so on, the pattern projected onto the wafer through the reducing lens by the light passing through this reticle has a high resolution.

Figure 21:
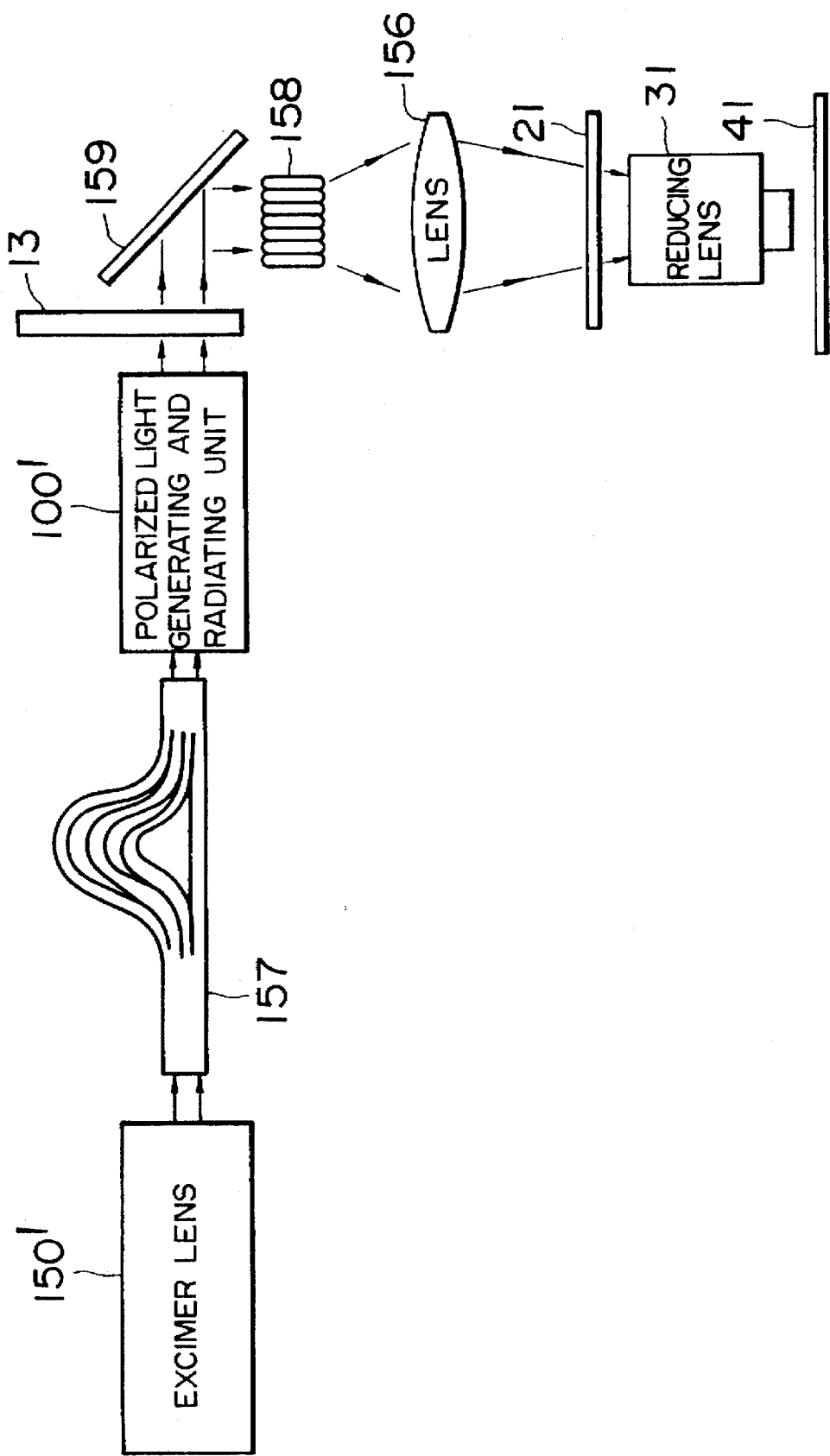
FIG. 21 is a plan view of the exposure apparatus using an excimer laser as the light source in the present invention.

FIG. 21 shows an exposure apparatus using an excimer laser according to the present invention. A laser beam emitted from a laser light source is launched into a fiber bundle 157. This bundle of fibers 157 is divided in the middle of its length into many small fiber bundles. The small fiber bundles have different lengths, the mutual differences in length among them being more than the coherence length. By this arrangement, the laser light rays coming out of the fiber light-emitting ends produce a uniform illumination without interference with each other.

The light emitted from the fiber ends are provided with a desired directivity and polarization characteristics by the polarized light generating and radiating means 100' and the rotary disc 13 described with reference to FIGS. 18A to 19G, and falls on a rod micro lens array. The rod micro lens array is effective in illuminating the reticle uniformly. The illuminating light having passed through the rod micro lens array passes through condenser lens 156, illuminates the reticle 21 as the pattern-dependent polarizing mask according to the present invention, and transfers a high-resolution pattern onto the wafer 41 through a reducing lens 31. If a KrF excimer laser is used, a pattern with a line width of 0.17 μm, which is said to be a design size of 1GDRAM, can be transferred onto the wafer. Moreover, by using a much shorter wavelength, a pattern of 0.1 μm line width can be transferred to the resist in the exposure step.

Figure 22:
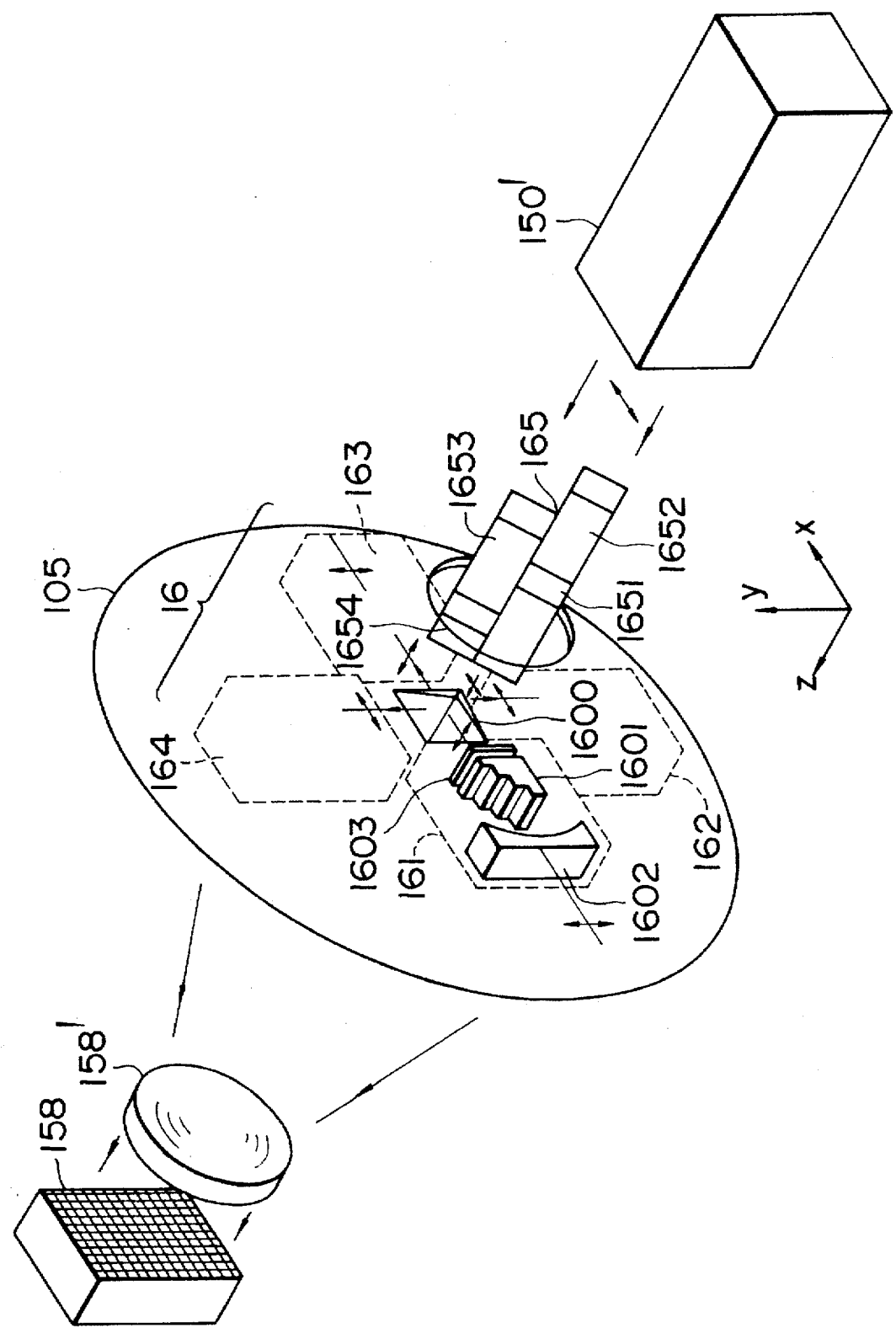
FIG. 22 is a perspective view of the exposure apparatus using an excimer laser as the light source in the present invention.

FIG. 22 is an embodiment of the present invention in which an excimer laser. The light emitted by the excimer laser 150' passes through an optical path length adjusting means 165 comprising four prisms 1651, 1652, 1653 and 1654, the optical path lengths of which are different between them by several times the coherence length of the laser. The four beams without coherence between them are reflected in four directions by a quadrangular pyramid mirror 1600.

Since the outgoing beams from the excimer laser 150' are linearly polarized light oscillating in the x direction, out of the light reflected by the quadrangular pyramid mirror, the light advancing in the y direction is a polarized light oscillating in the x direction. However, the light advancing in the x direction after being reflected, which should desirably be polarized in the y direction, is polarized in the z direction. Half-wave plates 1603 are installed for incoherent light diverging means 161 and 163 on which the light advancing in the x direction falls to change this light into a light polarized in the y direction. (The half-wave plate for the diverging means 163 is not shown.)

The incoherent light diverging means will be described. The other three incoherent light diverging means are not shown, but they are the same as the diverging means 161. The light entering the incoherent light diverging means 161 first passes through an optical path length adjusting means 1601. Here, the incident beam is divided into a plurality of components, and the differences in the optical path length between those components are made greater than the coherence length. At this stage, the light, which is parallel rays, is changed into divergent rays by a concave surface cylindrical lens 1602. the source of the divergent rays is substantially the optical axis of the laser in FIG. 22. The light rays diverged in four directions by the four incoherent light diverging means are reflected and converged by the quadratic surface mirror 105, and then are incident on a concave lens 158', by which the principal rays are substantially parallel and fall on a rod micro lens array 158. The structure from the rod micro lens array onward is the same as in the embodiment in FIG. 21.

Figure 23A:
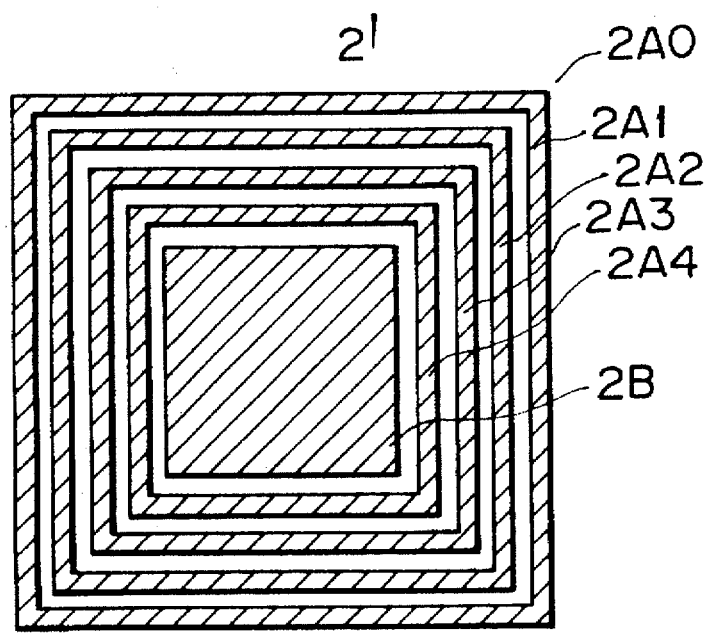
FIGS. 23A and 23B are plan views of mask patterns using a negative resist in the present invention.
Figure 23B:
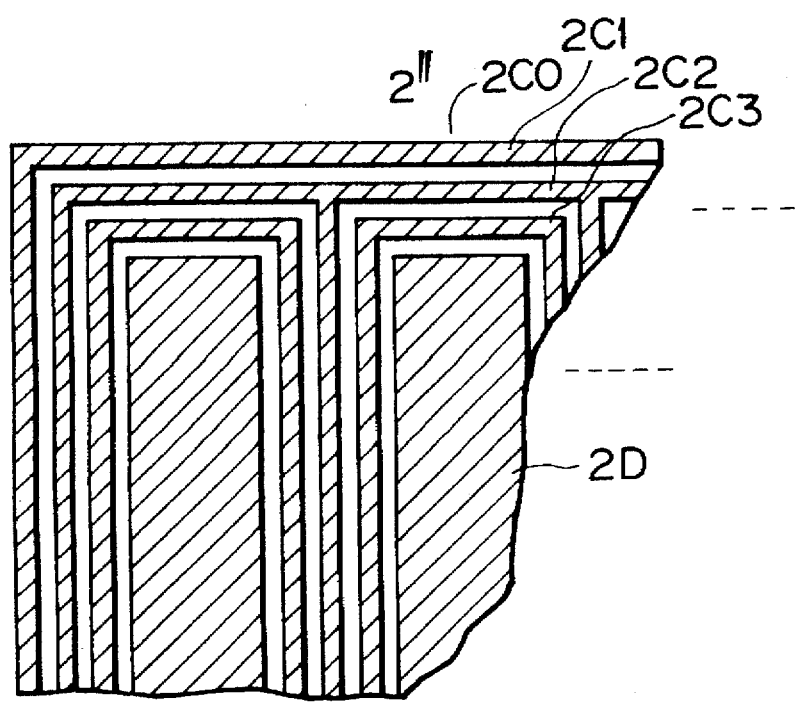

FIGS. 23A and 23B show an embodiment of the reticle pattern when the light is irradiated to a hole pattern to transfer it to a negative photoresist. FIG. 23A is an embodiment of exposure with a hole pattern. When a negative resist is used, after the developing step, the unexposed regions of the resist are removed, whereas the areas of the resist exposed to more than a certain amount of exposure are hardened and remain. A region 2B corresponding to the hole portion is an unexposed portion, and the patterns 2A1, 2A2, 2A3 and 2A4 are arranged to have polarization characteristics. The region 2A0 outside the regions with the above-mentioned polarization characteristics are the light-transmitting region with a transmittance of close to 100%. Under this condition, if polarized light ring zone illumination is implemented, the incident light from the direction perpendicularly intersecting the pattern edge of the region 2B passes through the regions 2A1 to 2A4 with the above-mentioned polarization characteristics, thus improving the resolution of the pattern edges. The intensity of the light passing through the regions 2A1 to 2A4 with the polarization characteristics is, because those regions do not transmit any polarized light which is at right angles with the polarization direction of the light, lower than the intensity of the light passing through the region 2A0. However, if this reduced intensity of those regions is still greater than a certain amount of exposure mentioned above, only the region 2B is formed as the hole pattern in the negative resist.

FIG. 23B shows a case where an L & S pattern is formed in a negative resist at the exposure step. Like in the case of FIG. 23A, the line region 2D is an opaque region, and there is provide a pattern with polarization characteristics between the lines. Around the periphery of the line pattern, patterns 2C1 to 2C3 with polarization characteristics are arranged as in the case of the hole pattern. If light is irradiated to the pattern so that the light quantity of the light transmitted through the areas with polarization characteristics is larger than a certain amount of exposure, an L & S pattern is formed in the negative resist with high resolution.

Figure 24A:
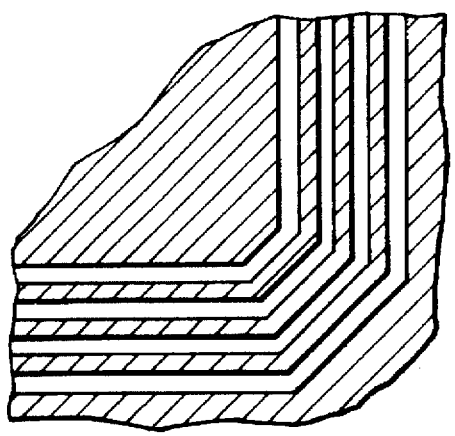
FIGS. 24A, 24B and 24C are plan views of fine patterns at the pattern corners and the pattern extreme ends in the present invention.
Figure 24B:
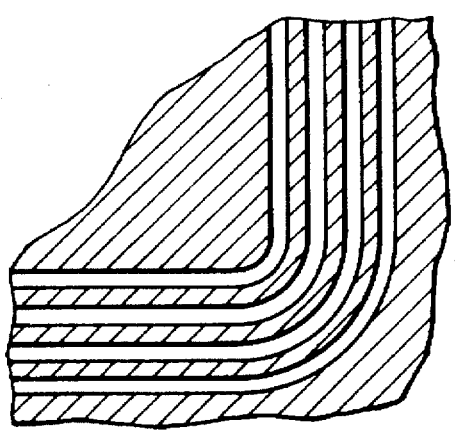
Figure 24C:
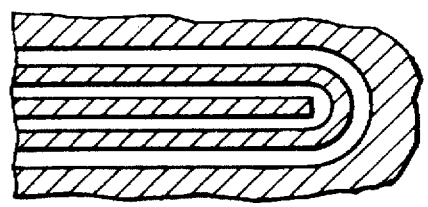

FIGS. 24A to 24C show an embodiment in which corners and edges of a pattern are transferred with high resolution to a positive resist at the exposure step. Even if it is attempted to provide polarization characteristics by delineating minute patterns less than a half of the wavelength of light at the corners or edges of a pattern, if the minute patterns bend at right angles, sufficient polarization characteristics sometimes cannot be obtained. In such a case, as shown in FIGS. 24A, 24B and 24C, by using patterns extending in 45° direction or circular patterns for the corners instead of right-angled patterns, better polarization characteristics can be achieved.

Figure 25A:
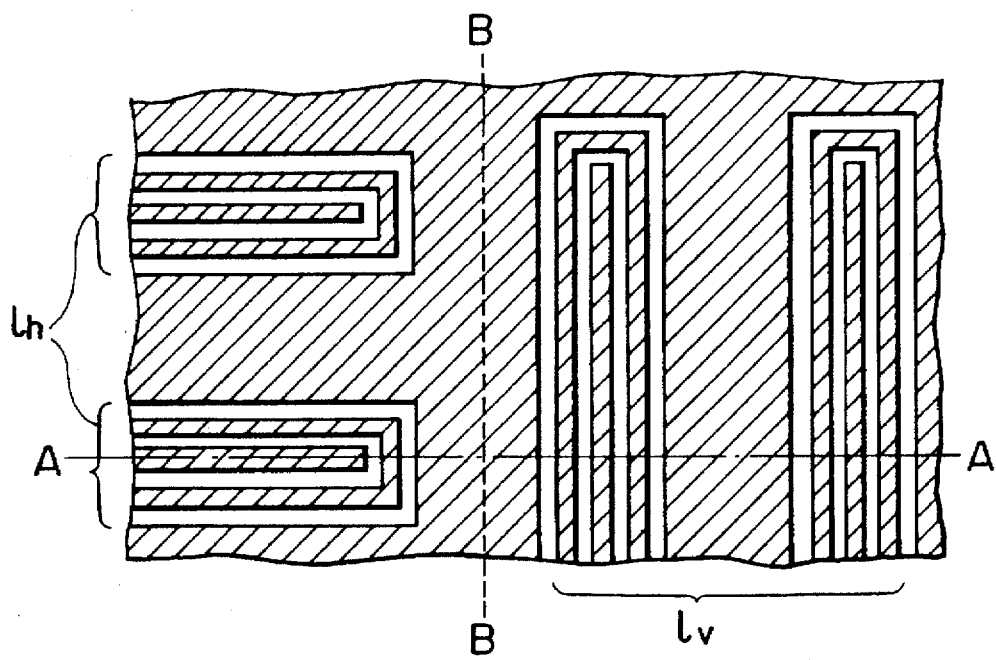
FIGS. 25A and 25B are a plan view and a side view of an isolation mask by a phase shifter of adjacent x-y direction patterns.
Figure 25B:
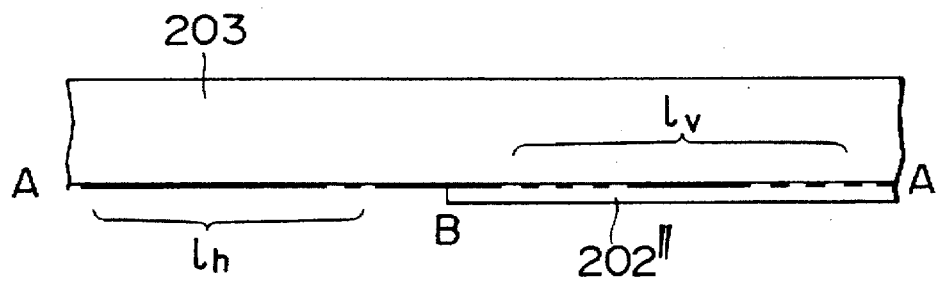
Figure 25C:
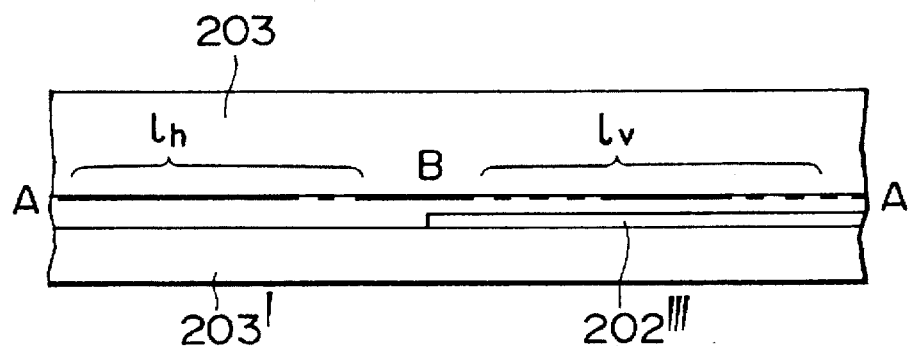
FIG. 25C is a side view of a mask-isolated pattern in the present invention.
Figure 26:
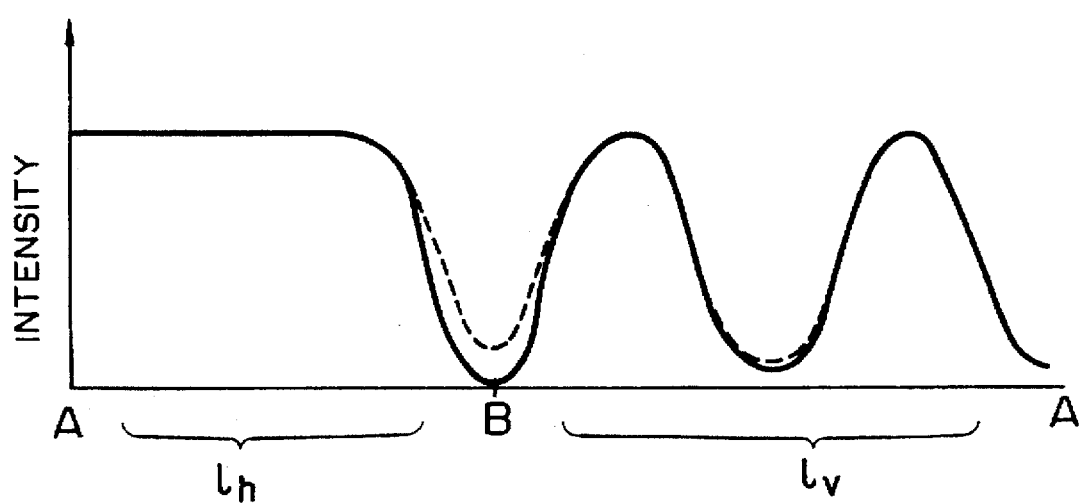
FIG. 26 is a diagram of a pattern (solid line) obtained by the method in FIGS. 25A, 25B and 25C, compared with the conventional pattern (broken line)

FIGS. 25A to 25C shows an embodiment intended to improve the polarization characteristics at the extreme ends of a pattern by additionally using a phase shifter in the super resolution method in the present invention. When a line pattern $l_h$ long in the horizontal direction is contact with a line pattern $l_V$ long in the vertical direction along the line B—B, it is sometimes difficult to sufficiently resolve the extreme end of the region $l_h$ and the left end of the region $l_V$ both facing the line B—B. In this case, a solution is to give a phase difference by $\pi$ between the transmitted light rays on the left side and the right side divided by the line B—B. FIG. 25B is a sectional view of this reticle, in which on the left side from the line B—B is a drawing of an ordinary reticle, but on the right side, there is provided a phase shifter 202" to shift the phase of the transmitted light by $\pi$. FIG. 25C shows a case where the above-mentioned shifter is delineated on another substrate separate from a glass substrate of the reticle on which patterns are written with Cr, and the two substrates are glued together. Since the pattern of this phase shifter is a rougher pattern than the ordinary phase shift reticle, it is easy to glue the two glass substrates together, and a higher resolution can be obtained for the pattern edges and the surroundings of the pattern. In FIG. 26, the dotted line indicates the light intensity of the region B—B when the phase shifter is not used, and the solid line indicates the light intensity of the region B—B when the phase shifter is used. The pattern indicated by the dotted line has a higher resolution than before, and the use of the phase shifter more clearly separates the patterns.

Figure 27A:
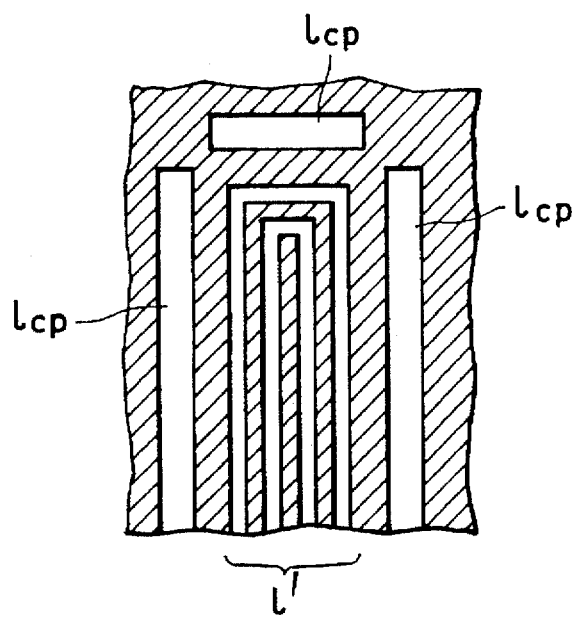
FIGS. 27A and 27B are a plan view and a side view of a pattern by the method using an auxiliary pattern according to the present invention.
Figure 27B:
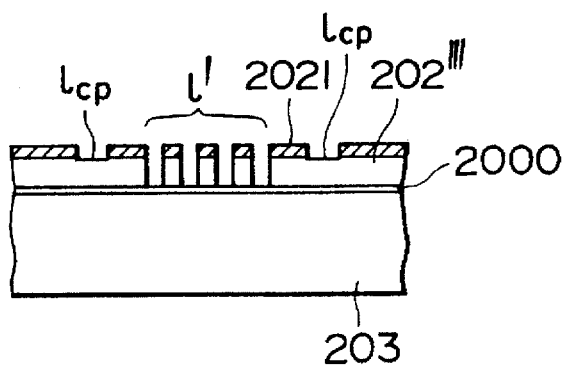
Figure 27C:
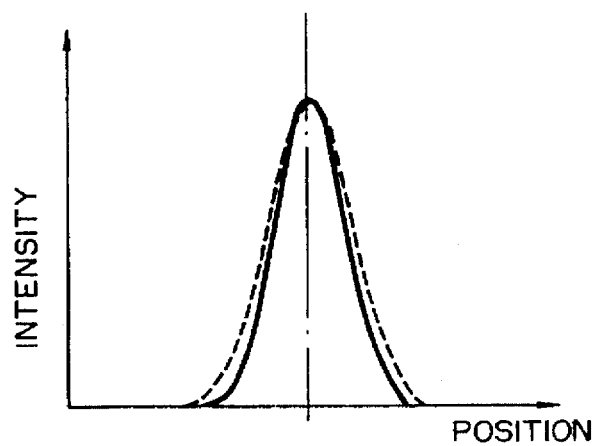
FIG. 27C is a graph for comparing the pattern by this method (solid line) and the pattern by the conventional method (broken line)

FIGS. 27A to 27C show an embodiment in which the super resolution method in the present invention is applied to isolated patterns in an effort to further improve the resolution. As shown in FIG. 27A, the region 1' is a region which has polarization characteristics described above. Around this line pattern, an complementary phase shifter pattern $l_{cp}$ is provided. As shown in FIG. 27B, as light passes through a transparent film 202''', the complementary phase shifter pattern $l_{cp}$ has the transmitted light out of phase by with the transmitted light of the line pattern region 1'. By this arrangement, as shown in FIG. 27C, a yet higher resolution pattern indicated by the solid line can be obtained—much higher than the pattern, indicated by the dotted line and achieved when the high resolution phase shifter is not used, which has a higher resolution than the pattern obtainable by the conventional exposure method.

Figure 28:
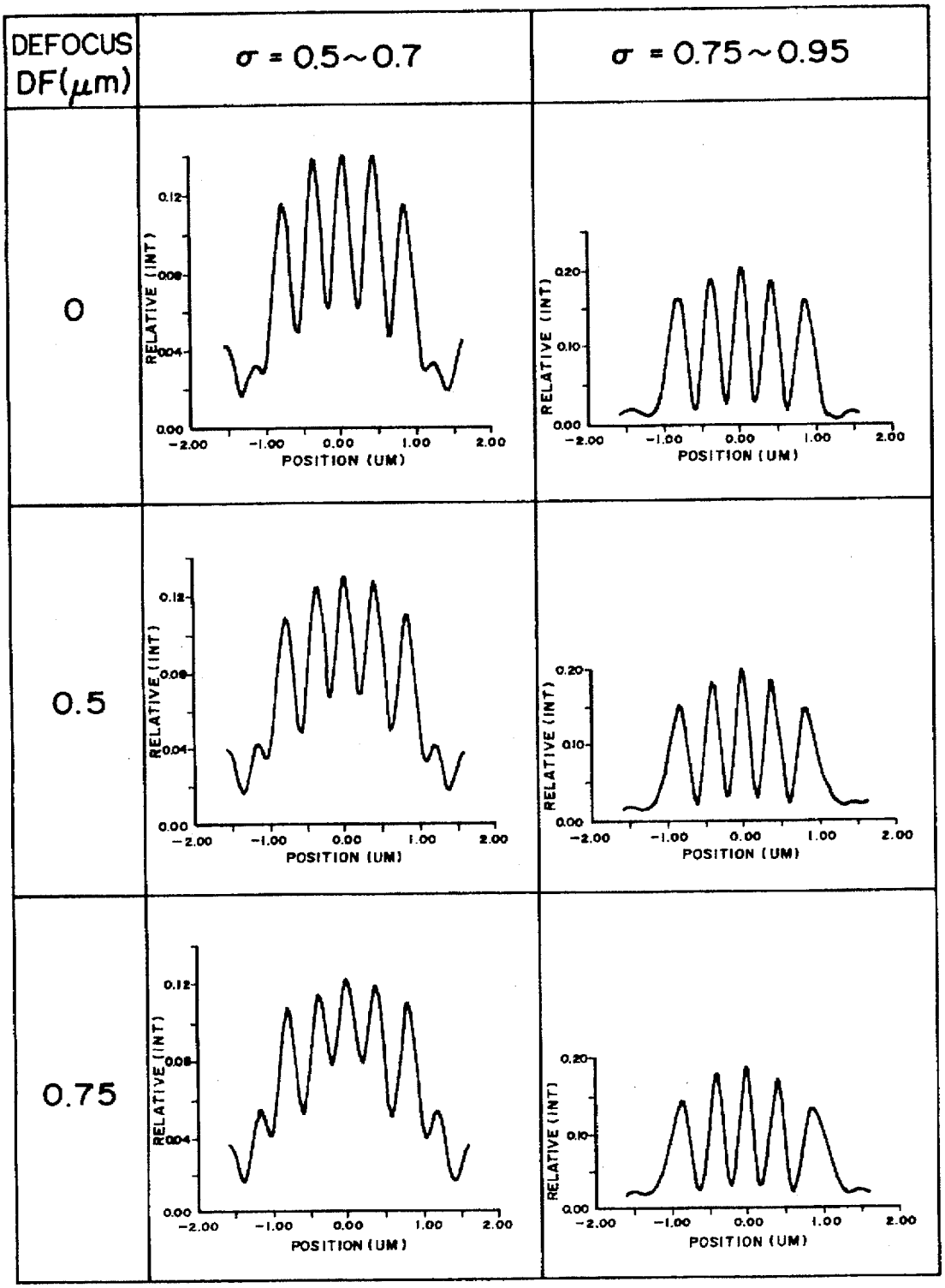
FIG. 28 is graphs showing the effects on the resolution of the directivity of illumination when a 0.2 μm pattern is resolved by the method according to the present invention.
Figure 29:
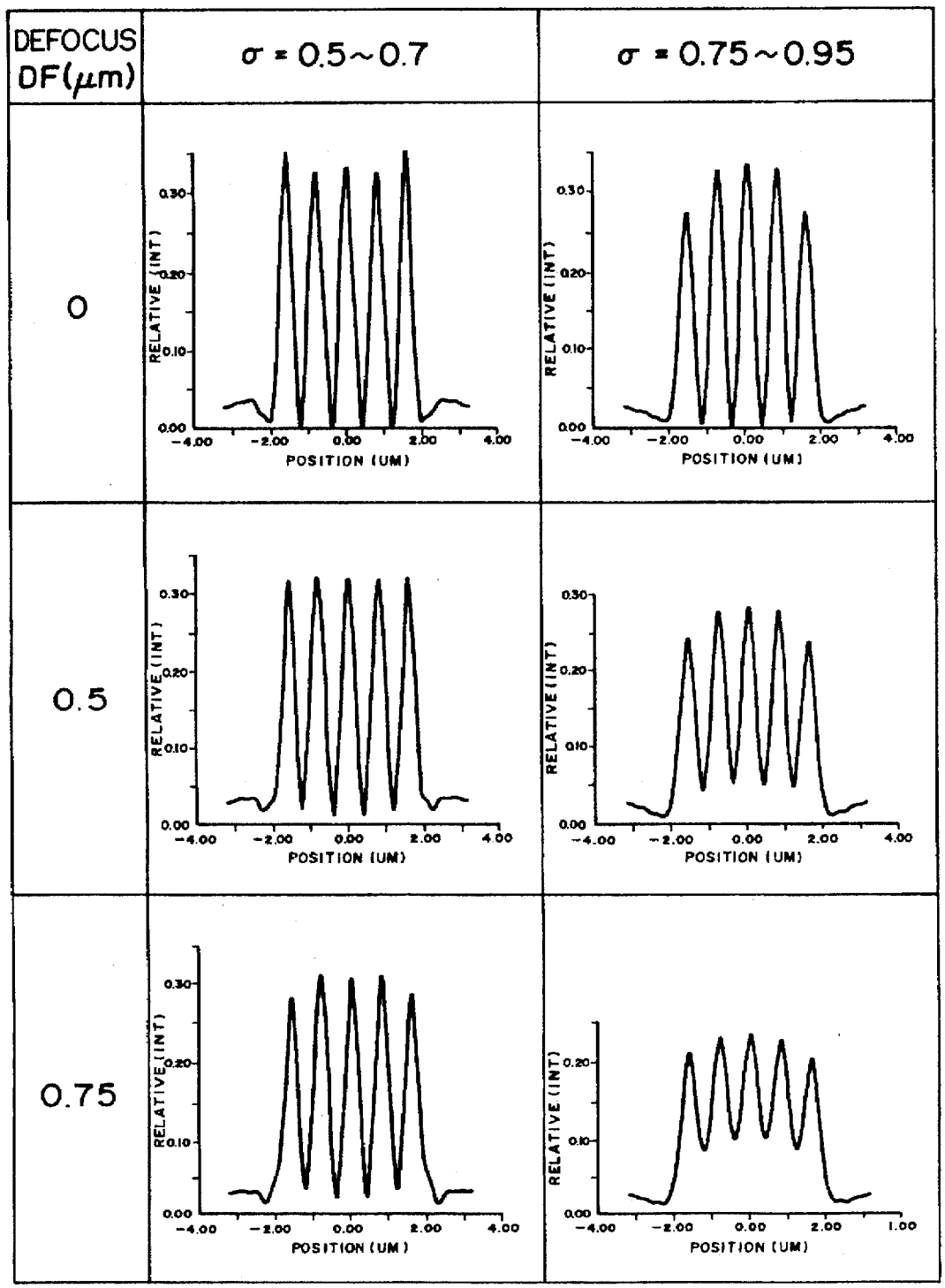
FIG. 29 is graphs showing the effects on the resolution of the directivity of illumination when a 0.4 μm pattern is resolved by the method according to the present invention.

The oblique incidence angle (illumination directivity $\sigma$) of polarized light ring zone illumination most suitable for a pattern line width to be resolved varies with a desired focal depth. This relation obtained by simulation is shown in FIGS. 28 and 29. If NA of the reducing exposure lens is 0.57 and the exposure light wavelength is i line (365 nm), for a pattern of 0.2 µm, a sufficient resolution cannot be obtained even at the best focus position (DF=0 µm) when $\sigma$ is 0.5 to 0.7 as shown in FIG. 28. On the other hand, the pattern can be sufficiently resolved up to the defocus at 0.75 µm as shown in FIG. 28 by setting $\sigma$ at 0.75 to 0.95. However, when a patter of 0.4 µm is used to expose the resist at the same wavelength of exposure light using the same lens, as shown in FIG. 29, when $\sigma$ is 0.75 to 0.95, contrary to the above case, the resolution deteriorates with defocus at 0.5 µm, but when $\sigma$ is 0.5 to 0.7, the pattern can be resolved sufficiently up to 0.75 µm. As described above,.by installing means for selecting the directivity $\sigma$ of the optimum ring zone illumination according to the line width of the pattern used for exposure and by selecting the optimum $\sigma$, desirable clear-cut patterns can be transferred to the resist at the exposure step for a wide range of pattern line width.

In the embodiments of the mask described above, the masks have been all transmission type masks, but by using reflection type masks, the object of the present invention can be achieved. In the above embodiments, as the pattern-dependent polarizing mask, masks of fine slit structure and minute polarizing prism structure have been used, but the object of the present invention can be achieved by arranging an anisotropic medium or a dichroic object in the light transmitting regions according to the direction of the pattern.

According to the exposure method in the present invention, it has become possible to transfer circuit patterns at the exposure step, which have been impossible to resolve by the conventional ring zone illumination. As a result, if the line width of repetitive patterns is denoted by w, the pitch of the repetitive patterns by p, the exposure light wavelength by λ, and the numerical aperture of the projection optical system by NA, it has become possible to fabricate semiconductor integrated circuits including circuit patterns which satisfy the following equations.

$$0.25 \, \lambda/NA < w < 0.5 \, \lambda/NA$$

$$0.5 \, \lambda/NA < p < 1.0 \, \lambda/NA$$

By using the pattern exposure method according to the present invention, by using the projection optical system of the conventional exposure apparatus as is, it has become possible to perform the exposure step to transfer patterns to the wafer with much better resolution than conventional patterns. A resulting improvement in the performance of semiconductor integrated circuits will contribute to an outstanding advancement of semiconductor IC technology, and a great increase in the yield in production of semiconductor integrated circuits. Possible reductions of the investment in the production facilities for semiconductor integrated circuits, which will be made possible by the techniques according to the present invention, will bring about sizable economic effects.

We claim:

1. A pattern exposure method comprising the steps of:
    irradiating a mask or a reticle having a desired original pattern written thereon with light with a desired directivity of ring zone illumination from an illuminating light source for exposure;
    projecting a transmitted or reflected light from said mask to an object to be exposed through a projection optical system to transfer an image from said original pattern to said exposed object; and
    providing symmetric polarization characteristics in compliance with the direction of the pattern on said mask to said illuminating light transmitted through said pattern.

2. A pattern exposure method according to claim 1, wherein a polarization of said ring zone illumination on a pupil of said projection optical system is nearly rotationally symmetric with respect to the center of the pupil of said projection optical system when said mask is not used.

3. A pattern exposure method according to claim 1, wherein a polarizer element or an analyzer element for polarizing light of the ring zone illumination so as to be nearly rotationally symmetric with respect to the center of the pupil is arranged in the vicinity of the pupil of said projection optical system.

4. A pattern exposure method according to claim 1, wherein said mask is formed such that a tangent direction of an edge of the pattern on the mask and a polarization direction of said illuminating light transmitted through or reflected by said pattern are nearly parallel with each other.

5. A pattern exposure method according to claim 1, wherein said mask is formed such that the pattern on the mask comprises portion A transmitting or reflecting the illuminating light and portion B slighting transmitting or reflecting the light, but substantially blocking or hardly reflecting the light, and wherein the rays of light transmitted through portion A and portion B are 180° out of phase with each other.

6. A pattern exposure method according to claim 5, wherein the amplitude transmittance or the amplitude reflectance of said portion B substantiality blocking the light is 30% or less of the amplitude transmittance or the amplitude reflectance of said portion a transmitting the light.

7. A pattern exposure method according to claims 6, wherein said amplitude transmittance or the amplitude reflectance is nearly 22%.

8. A pattern exposure method according to claim 1, wherein the directivity of said ring zone illumination light is such that one of ± first-order light rays of diffracted light from a minimum pattern on the mask illuminated by the illuminating light passes through the pupil of said projection optical system and the other does not pass through the pupil.

9. A pattern exposure method according to claim 1, wherein the directivity of said ring zone illumination is variable according to the line width of the pattern on the mask.

10. A pattern exposure method according to claim 1, wherein said object to be exposed is a negative sensitized material, and wherein a desired pattern on the mask is a light blocking region and a pattern having polarization characteristics is written around said light blocking region.

11. A pattern exposure method according to claim 10, wherein said pattern having polarization characteristics written around said light blocking region has nearly the same width as a pattern width resolvable with said projection optical system.

12. A pattern exposure method according to claim 1, wherein a mask with polarization characteristics is provided in combination with a phase shifter.

13. A pattern exposure method according to claim 12, wherein said phase shifter is arranged to produce a phase differenc of π between patterns or groups of patterns.

14. A pattern exposure method according to claim 12, wherein said phase shifter is provided around an isolated pattern or a group of patterns in such a fine form as not to be resolved by said projection optical system.

15. A pattern exposure apparatus comprising:
    an illuminating light source for exposure;
    a mask or reticle having a desired original pattern written thereon;
    an illumination optical system for irradiating said mask with light having ring zone illumination with a desired directivity, emitted from said light source; and
    a projection optical system for projecting the light transmitted through or reflected from said mask onto an object to be exposed, the improvement comprising:
    polarizing means for polarizing said illuminating light of the ring zone illumination on the pupil of said projection optical system so as to be nearly rotationally symmetric with respect to the center of the pupil.

16. A pattern exposure apparatus according to claim 15, wherein said polarizing means is included effectively in said illumination optical system.

17. A pattern exposure apparatus according to claim 15, wherein said polarizing means is included in said projection optical system.

18. A pattern exposure apparatus according to claim 15, wherein said illuminating light source is an excimer laser.

19. A pattern exposure apparatus according to claim 15, wherein a modified type of illuminating means for realizing the ring zone illumination includes means for varying the directivity of said ring zone illumination.

20. A pattern exposure apparatus according to claim 19, wherein said means for varying the directivity of said illumination controls means for varying the directivity so that the directivity becomes optimum for the line width of an exposure pattern.

21. A pattern exposure apparatus according to claim 19, wherein said means for varying the directivity of said ring zone illumination uses flexible optical fiber.

22. A pattern exposure apparatus according to claim 19, wherein said means for varying the directivity of said ring zone illumination makes it possible to realize ordinary illumination not on a rotation system.

23. A mask for giving pattern-dependent polarization characteristics in compliance with the direction of a pattern on the mask to an illuminating light transmitted through or reflected by said pattern, wherein the pattern on the mask comprises portion A transmitting or reflecting the illuminating light and portion B slightly transmitting or reflecting the light but substantially blocking or hardly reflecting the light, wherein the light rays passing through portions A and B are 180° out of phase with each other, and wherein the amplitude transmittance or the amplitude reflectance of said portion B substantially blocking the light is in effect 30% or less of the amplitude transmittance or the amplitude reflectance of said portion A transmitting the light.

24. A mask according to claim 23, wherein the amplitude transmittance or the amplitude reflectance of said portion B substantially blocking the light is in effect substantially 22% of the amplitude transmittance or the amplitude reflectance of said portion A transmitting the light.

25. A mask according to any of claims 23, and 24, wherein said portion B substantially blocking the light is located in a limited manner in the vicinity of said portion A transmitting the light.

26. A semiconductor integrated circuit formed by a pattern exposure method comprising the steps of:

irradiating a mask or a reticle having a desired original pattern written thereon with light from an illuminating light source for exposure with a desired directivity; and projecting a transmitted or reflected light from said mask to an object to be exposed through a projection optical system to transfer an image from said original pattern to said exposed object, wherein as for the directivity of illuminating light, said illuminating light is provided by ring zone illumination, and wherein said semiconductor integrated circuit includes fine patterns at least in two directions formed by a pattern exposure method using a pattern-dependent polarizing mask for giving symmetric polarization characteristics in compliance with the direction of the pattern on said mask to said illuminating light of the ring zone illumination transmitted through said pattern.

27. A semiconductor integrated circuit according to claim 26, wherein said fine patterns in two directions include repetitive patterns, and wherein if the line width of the repetitive patterns is denoted by w, the pitch of the repetitive patterns by p, the exposure light wavelength by $\lambda$, and the numerical aperture of the projection optical system by NA, 0.25 $\lambda$/NA<w<0.5 $\lambda$/NA or 0.5 $\lambda$/NA<p<1.0 $\lambda$/NA is satisfied.

28. A semiconductor integrated circuit according to claim 26, including a pattern unable to be transferred to the wafer by a phase shifter method at exposure, and pattern transfer at exposure is perform by light whose wavelength $\lambda$ satisfies 0.25 $\lambda$/NA<w<0.5 $\lambda$/NA or 0.5 $\lambda$/NA<p<1.0 $\lambda$/NA and is 150 nm or longer, wherein w is the line width of the pattern, p is the pitch of the pattern, and NA is the numerical aperture of the projection optical system.

29. A semiconductor integrated circuit according to claim 28, wherein said semiconductor integrated circuit includes a pattern lying at 45° from two directions intersecting at right angles with each other.

30. A pattern exposure method comprising the steps of:

providing an exposure light with polarization characteristics which are symmetric to a light axis of an exposure light system wherein the exposure light exposes a mask with light having a ring shape at a pupil of the exposure light system; and exposing the exposure light on a substrate by imaging a pattern of the mask on the substrate.

31. A pattern exposure method according to claim 30, wherein the exposure light is excimer laser light.

32. A pattern exposure method according to claim 30, wherein the exposure light is polarized at a light source.

33. A pattern exposure method according to claim 30, wherein the exposure light is polarized at a pupil of the exposure light system.

34. A pattern exposure apparatus comprising:

an illuminating light source for exposure which radiates a ring shape illuminating light;

a projection optical system which projects the illuminating light onto a surface of an object to be exposed; and a polarizer which symmetrically polarizes the illuminating light to a light axis of the illuminating light source so as to expose the object with the illuminating light which is symmetrically polarized to the light axis of the illuminating light source at a pupil of the projection optical system.

35. A pattern exposure apparatus according to claim 34, wherein the illuminating light source is an excimer laser.

36. A pattern exposure apparatus according to claim 34, wherein the polarizer is provided at the illuminating light source.

37. A pattern exposure apparatus according to claim 34, wherein the polarizer is provided at a pupil of the projection optical system.

38. A pattern exposure method comprising the steps of:

irradiating a mask or a reticle having a desired original pattern written thereon with light with a desired directivity from an illuminating light source for exposure;

projecting a transmitted or reflected light from said mask to an object to be exposed through a projection optical system to transfer an image from said original pattern to said exposed object; and providing a pattern-dependent polarizing mask for giving polarizing characteristics in compliance with the direction of the pattern on said mask to said illuminating light transmitted through said pattern;

wherein as for the directivity of illuminating light, said illuminating light is provided by ring zone illumination or oblique illumination; and wherein said mask is formed such that the pattern on the mask comprises portion A transmitting or reflecting the illuminating light and portion B slightly transmitting or reflecting the light, but substantially blocking or partly reflecting the light, wherein the rays of light transmitted through portion A and B are 180° out of phase with each other, and wherein the amplitude transmittance or the amplitude reflectance of said portion B substantially blocking the light is 30% or less of the amplitude transmittance or the amplitude reflectance of said portion A transmitting the light.

39. A pattern exposure method according to claim 38, wherein the amplitude transmittance or the amplitude reflectance is nearly 22%.

* * * * *